US010034392B2

(12) United States Patent
Gothait et al.

(10) Patent No.: US 10,034,392 B2
(45) Date of Patent: Jul. 24, 2018

(54) METHOD AND SYSTEM FOR NOZZLE COMPENSATION IN NON-CONTACT MATERIAL DEPOSITION

(71) Applicant: XJET LTD., Rehovot (IL)

(72) Inventors: Hanan Gothait, Rehovot (IL); Ran Asher Peleg, Kefar-Saba (IL); Ofir Baharav, Los Altos Hills, CA (US)

(73) Assignee: XJET LTD, Rehovot (IL)

( * ) Notice: Subject to any disclaimer, the term of this patent is extended or adjusted under 35 U.S.C. 154(b) by 0 days.

(21) Appl. No.: 14/886,251

(22) Filed: Oct. 19, 2015

(65) Prior Publication Data

US 2016/0205787 A1 Jul. 14, 2016

Related U.S. Application Data

(63) Continuation of application No. 12/487,173, filed on Jun. 18, 2009, which is a continuation-in-part of
(Continued)

(51) Int. Cl.
*B41J 2/155* (2006.01)
*H05K 3/46* (2006.01)
(Continued)

(52) U.S. Cl.
CPC ............ *H05K 3/46* (2013.01); *B41J 2/16579* (2013.01); *B41J 2/16588* (2013.01);
(Continued)

(58) Field of Classification Search
USPC ................. 347/13, 40, 43; 361/600
See application file for complete search history.

(56) References Cited

U.S. PATENT DOCUMENTS 3,451,791 A 6/1969 Meadows
4,847,636 A 7/1989 Durbeck et al.
(Continued)

FOREIGN PATENT DOCUMENTS

DE 4324647 1/1994
EP 1413442 4/2004
EP 1 462 264 9/2004
EP 1452 319 9/2004
(Continued)

OTHER PUBLICATIONS

Ahn B. Y. et al, "Printed Origami Structures"—Published online: Apr. 15, 2010 (4 pages).
(Continued)

*Primary Examiner* — Lam Nguyen
(74) *Attorney, Agent, or Firm* — Finnegan, Henderson, Farabow, Garrett & Dunner, LLP

(57) ABSTRACT

A method of printing is provided where printing is using a first printing unit having redundant nozzles. Then, the method may include stopping the printing with the first printing unit while continuing the printing with active nozzles of a second printing unit. The method may include inspecting the first printing unit and identifying faulty nozzles, then designating the faulty nozzles as inactive and designating inactive nozzles of the first printing unit as a new active nozzle. According to some embodiments the method may include moving the first printing unit to an inspection zone prior to inspecting while continuing the printing with active nozzles of a second printing unit and moving the first printing unit back to the printing zone after inspection and continuing the printing with the first printing unit.

12 Claims, 15 Drawing Sheets

Related U.S. Application Data application No. 12/134,294, filed on Jun. 6, 2008, now Pat. No. 7,580,271.

(60) Provisional application No. 61/073,889, filed on Jun. 19, 2008, provisional application No. 60/867,423, filed on Nov. 28, 2006.

(51) Int. Cl.
    *B41J 2/165*     (2006.01)
    *B41J 2/21*     (2006.01)

(52) U.S. Cl.
    CPC ........... *B41J 2/2139* (2013.01); *B41J 2/2142* (2013.01); *B41J 2/2146* (2013.01)

(56) References Cited

U.S. PATENT DOCUMENTS

| | | | |
|---|---|---|---|
| 5,136,515 A | 8/1992 | Helinski | |
| 5,151,377 A | 9/1992 | Hanoka et al. | |
| 5,371,531 A | 12/1994 | Rezanka et al. | |
| 5,587,730 A | 12/1996 | Karz | |
| 5,640,183 A | 6/1997 | Hackleman | |
| 5,838,343 A | 11/1998 | Johns et al. | |
| 5,906,156 A | 5/1999 | Shibuya et al. | |
| 6,010,205 A | 1/2000 | Billet | |
| 6,291,123 B1 | 9/2001 | Ohno et al. | |
| 6,293,648 B1 | 9/2001 | Anderson | |
| 6,305,769 B1 | 10/2001 | Thayer et al. | |
| 6,328,418 B1 | 12/2001 | Yamada et al. | |
| 6,471,352 B2 | 10/2002 | Akahira | |
| 6,514,343 B1 | 2/2003 | Motoda | |
| 6,536,853 B2 | 3/2003 | Egle et al. | |
| 6,585,347 B1 | 7/2003 | Johnson et al. | |
| 6,739,687 B1 | 5/2004 | Rasmussen et al. | |
| 6,814,421 B2 | 11/2004 | Maher | |
| 6,824,245 B2 * | 11/2004 | Silverbrook | B41J 2/14 347/13 |
| 6,869,162 B2 | 3/2005 | Maher | |
| 6,890,056 B2 | 5/2005 | Johnson et al. | |
| 7,037,448 B2 | 5/2006 | Nagai et al. | |
| 7,278,699 B2 | 10/2007 | Drake et al. | |
| 7,393,073 B2 | 7/2008 | Zach | |
| 7,407,256 B2 | 8/2008 | Han | |
| 7,494,607 B2 | 2/2009 | Wang et al. | |
| 7,502,023 B2 | 3/2009 | Zinniel et al. | |
| 7,506,960 B2 | 3/2009 | Chikanawa et al. | |
| 7,513,595 B2 | 4/2009 | Nakamura | |
| 7,556,334 B2 | 7/2009 | White et al. | |
| 7,604,320 B2 * | 10/2009 | Robertson | B41J 2/16526 347/109 |
| 7,625,063 B2 | 12/2009 | White et al. | |
| 7,718,092 B2 | 5/2010 | Rose et al. | |
| 7,919,538 B2 | 4/2011 | Vo et al. | |
| 9,004,667 B2 | 4/2015 | Taguchi | |
| 2002/0015655 A1 | 2/2002 | Sajoto et al. | |
| 2003/0222939 A1 | 12/2003 | Gompertz | |
| 2004/0135269 A1 | 1/2004 | Otsuki | |
| 2004/0041892 A1 | 3/2004 | Yoneyama et al. | |
| 2004/0056915 A1 | 3/2004 | Miyazawa | |
| 2004/0080564 A1 | 4/2004 | Maher | |
| 2004/0115339 A1 | 6/2004 | Ito | |
| 2004/0151978 A1 | 8/2004 | Huang | |
| 2004/0189736 A1 | 9/2004 | Maher | |
| 2004/0246294 A1 | 12/2004 | Mitsuzawa | |
| 2005/0057602 A1 | 3/2005 | Okamoto | |
| 2005/0078133 A1 | 4/2005 | Molinet et al. | |
| 2005/0088479 A1 | 4/2005 | Steinfield et al. | |
| 2005/0104241 A1 | 5/2005 | Kritchman et al. | |
| 2005/0253879 A1 | 11/2005 | Yamanobe | |
| 2006/0044331 A1 | 3/2006 | Tsutsumi et al. | |
| 2006/0045962 A1 * | 3/2006 | Miura | C23C 26/02 427/96.1 |
| 2006/0071957 A1 | 4/2006 | Shang et al. | |
| 2006/0092204 A1 | 5/2006 | White et al. | |

| | | |
|---|---|---|
| 2006/0092218 A1 | 5/2006 | White et al. |
| 2006/0092219 A1 | 5/2006 | Kurita et al. |
| 2006/0093751 A1 | 5/2006 | White et al. |
| 2006/0103707 A1 | 5/2006 | Askeland et al. |
| 2006/0132571 A1 | 6/2006 | Baker et al. |
| 2006/0139394 A1 | 6/2006 | Wada |
| 2006/0159843 A1 | 7/2006 | Sze et al. |
| 2006/0185587 A1 | 8/2006 | Shang et al. |
| 2006/0284906 A1 | 12/2006 | Jeong et al. |
| 2007/0024664 A1 | 2/2007 | Shang et al. |
| 2007/0042113 A1 | 2/2007 | Ji et al. |
| 2007/0063366 A1 | 3/2007 | Cunningham et al. |
| 2007/0068560 A1 | 3/2007 | Shang et al. |
| 2007/0070640 A1 | 3/2007 | Sexton |
| 2007/0107773 A1 | 5/2007 | Fork et al. |
| 2007/0153035 A1 | 7/2007 | Jung et al. |
| 2007/0211105 A1 | 9/2007 | Furukawa |
| 2007/0222817 A1 | 9/2007 | Kurita et al. |
| 2007/0256709 A1 | 11/2007 | Shang et al. |
| 2007/0263026 A1 | 11/2007 | Shang et al. |
| 2008/0018677 A1 | 1/2008 | White et al. |
| 2008/0024532 A1 | 1/2008 | Kim |
| 2008/0024557 A1 | 1/2008 | Moynihan |
| 2008/0158278 A1 | 7/2008 | Inoue |
| 2008/0186354 A1 | 8/2008 | White |
| 2008/0259101 A1 | 10/2008 | Kurita et al. |
| 2008/0314276 A1 | 12/2008 | Gothait et al. |
| 2009/0058941 A1 | 3/2009 | Kurita et al. |
| 2009/0145479 A1 | 6/2009 | Williams |
| 2009/0244153 A1 | 10/2009 | Miyamoto |
| 2009/0267975 A1 | 10/2009 | White et al. |
| 2009/0321123 A1 | 12/2009 | Lochtman et al. |
| 2010/0040767 A1 | 2/2010 | Uibel et al. |
| 2010/0061925 A1 | 3/2010 | Lee et al. |
| 2011/0151665 A1 | 6/2011 | Gothati et al. |
| 2011/0279544 A1 | 11/2011 | Dovrat et al. |
| 2012/0015152 A1 | 1/2012 | Takahashi et al. |
| 2012/0062640 A1 | 3/2012 | Uraki et al. |
| 2012/0081455 A1 | 4/2012 | Kritchman et al. |
| 2012/0308837 A1 | 12/2012 | Schlechtriemen et al. |
| 2013/0141491 A1 | 6/2013 | Krichtman et al. |
| 2013/0176355 A1 | 7/2013 | Kritchman et al. |
| 2013/0208048 A1 | 8/2013 | Kritchman et al. |
| 2014/0360762 A1 | 12/2014 | Lee |
| 2015/0255632 A1 | 9/2015 | Kritchman et al. |
| 2015/0298394 A1 | 10/2015 | Sheinman |
| 2016/0039207 A1 | 2/2016 | Kritchman et al. |
| 2016/0229128 A1 | 8/2016 | Dayagi et al. |
| 2016/0236372 A1 | 8/2016 | Benichou et al. |
| 2016/0243619 A1 | 8/2016 | Gothait et al. |

FOREIGN PATENT DOCUMENTS

| | | |
|---|---|---|
| EP | 1462257 | 9/2004 |
| EP | 1 525 990 | 4/2005 |
| EP | 1 886 815 | 2/2008 |
| EP | 1 918 026 | 5/2008 |
| JP | 03-184852 | 8/1991 |
| JP | 04-235054 | 8/1992 |
| JP | H09-193404 | 7/1997 |
| JP | 11-342598 | 12/1999 |
| JP | H11-342598 | 12/1999 |
| JP | 2001-44601 | 2/2001 |
| JP | 2002-324966 | 11/2002 |
| JP | 2003-133692 | 5/2003 |
| JP | 2004-351677 | 12/2004 |
| JP | 2007-152161 | 6/2006 |
| JP | 2007-061784 | 3/2007 |
| JP | 2008-124413 | 5/2008 |
| JP | 2010-069856 | 5/2008 |
| JP | 2011-016301 | 1/2011 |
| WO | WO 2006/052828 | 5/2006 |
| WO | WO 2006/078702 | 7/2006 |
| WO | WO 2006/081310 | 8/2006 |
| WO | WO 2007/002660 | 1/2007 |
| WO | WO 2007/041229 | 1/2007 |
| WO | WO 2007/040970 | 4/2007 |
| WO | WO 2007/076424 | 7/2007 |
| WO | WO 2008/013839 | 1/2008 |

(56) References Cited

FOREIGN PATENT DOCUMENTS

| WO | WO 2008/065657 | 6/2008 |
|----|----------------|--------|
| WO | WO 2008/084972 | 7/2008 |
| WO | WO 2009/017648 | 2/2009 |
| WO | WO 2009/029939 | 2/2009 |
| WO | WO 2009/029890 | 3/2009 |
| WO | WO 2009/141448 | 11/2009 |
| WO | WO 2014/068579 | 11/2009 |

OTHER PUBLICATIONS

Hong E. et al, "Microstructure and Mechanical Properties of Reticulated Titanium Scrolls"—Published online: Aug. 29, 2011 (6 pages).
TriTrust Industrial, "Preparation of superfine TiH2 powder with high energy ball milling"—Published onilne: Oct. 9, 2014 (2 pages).
International Search Report dated Feb. 17, 2015 in International Application No. PCT/IB2014/065400 (6 pages).
International Search Report dated Feb. 19, 2016 in International Application No. PCT/IL2013050453 (7 pages).
International Search Report dated Jan. 11, 2015 in International Application No. PCT/IB2014/065401 (6 pages).
International Search Report dated Oct. 17, 2014 in International Application No. PCT/IB2014/065402 (7 pages).
Cappi B. et al. "Direct inkjet printing of Si3N4: Characterization of ink, green bodies and microstructure", 2008, Journal of the European Ceramic Society, vol. 28 pp. 2625-2628 (published on line:Apr. 28, 2008).
Mott M. et al."Microengineering of Ceramics by Direct Ink-Jet Printing", 1999, J. Am. Ceram. Soc., vol. 82, No. 7, pp. 1653-1658 (Jul. 31, 1999) DOI: 10.1111/j.1151-2916.1999.tb0.
Ozkol E. et al. "Development of high solid content aqueous 3Y-TZP suspensions for direct inkjet printing using a thermal inkjet printer", 2009, Journal of the European Ceramic Society, vol. 29, pp. 403-409 (published on line: Aug. 13, 2008).
Song H. J. et al. "Formulation and Multilayer jet Printing of Ceramic inks", 1999, J. Am. 1-3,13-17,27,28 Ceram. Soc. vol. 82, pp. 3374-3380 (Dec. 31, 1999).
Office Action for U.S. Appl. No. 12/967,245 dated Oct. 12, 2011.
U.S. Office Action for U.S. Appl. No. 12/134,294, dated Mar. 25, 2010.
International Search Report for International Appl. No. PCT/ILO?/01468; dated Jul. 2, 2008.

\* cited by examiner

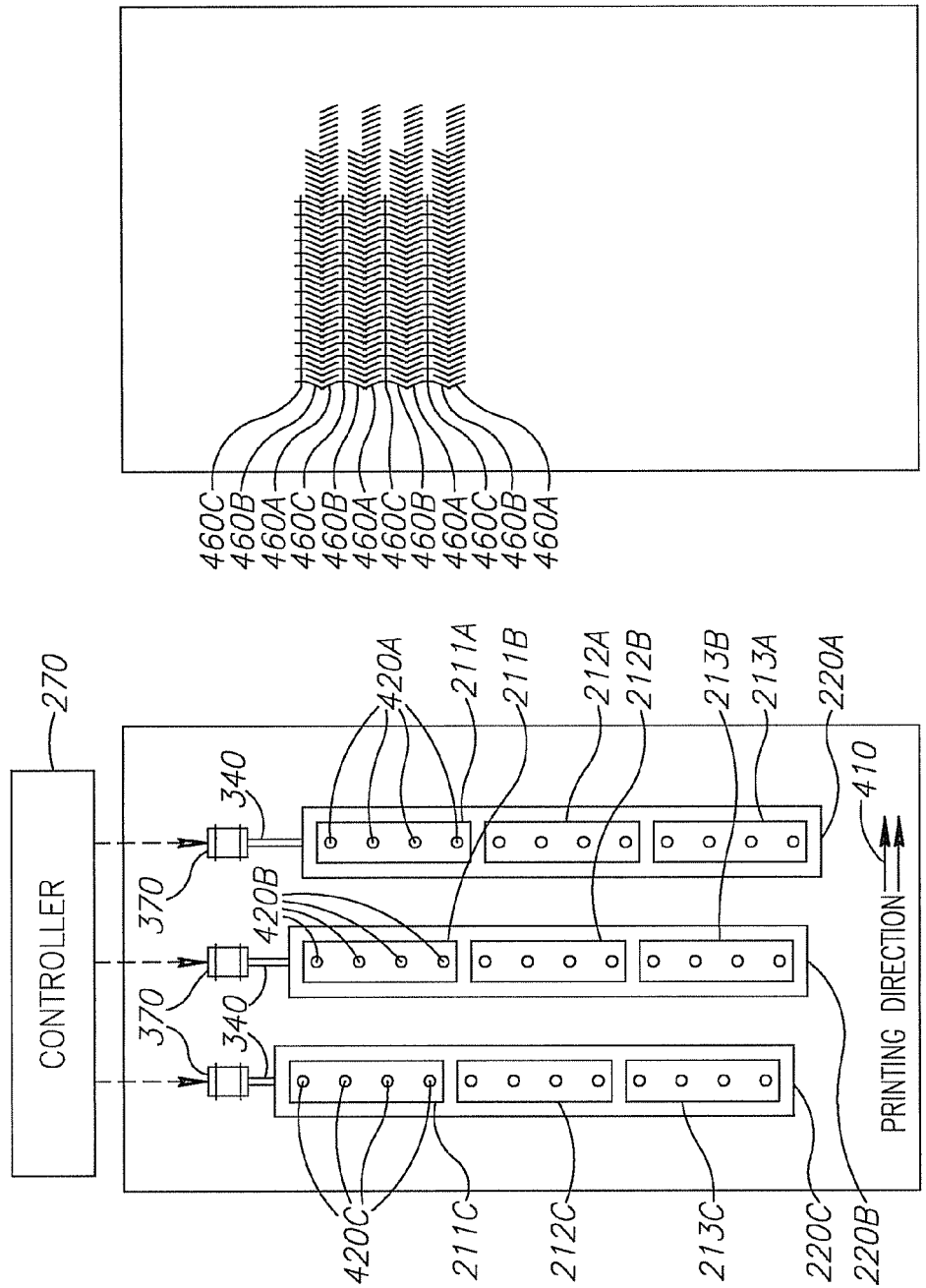

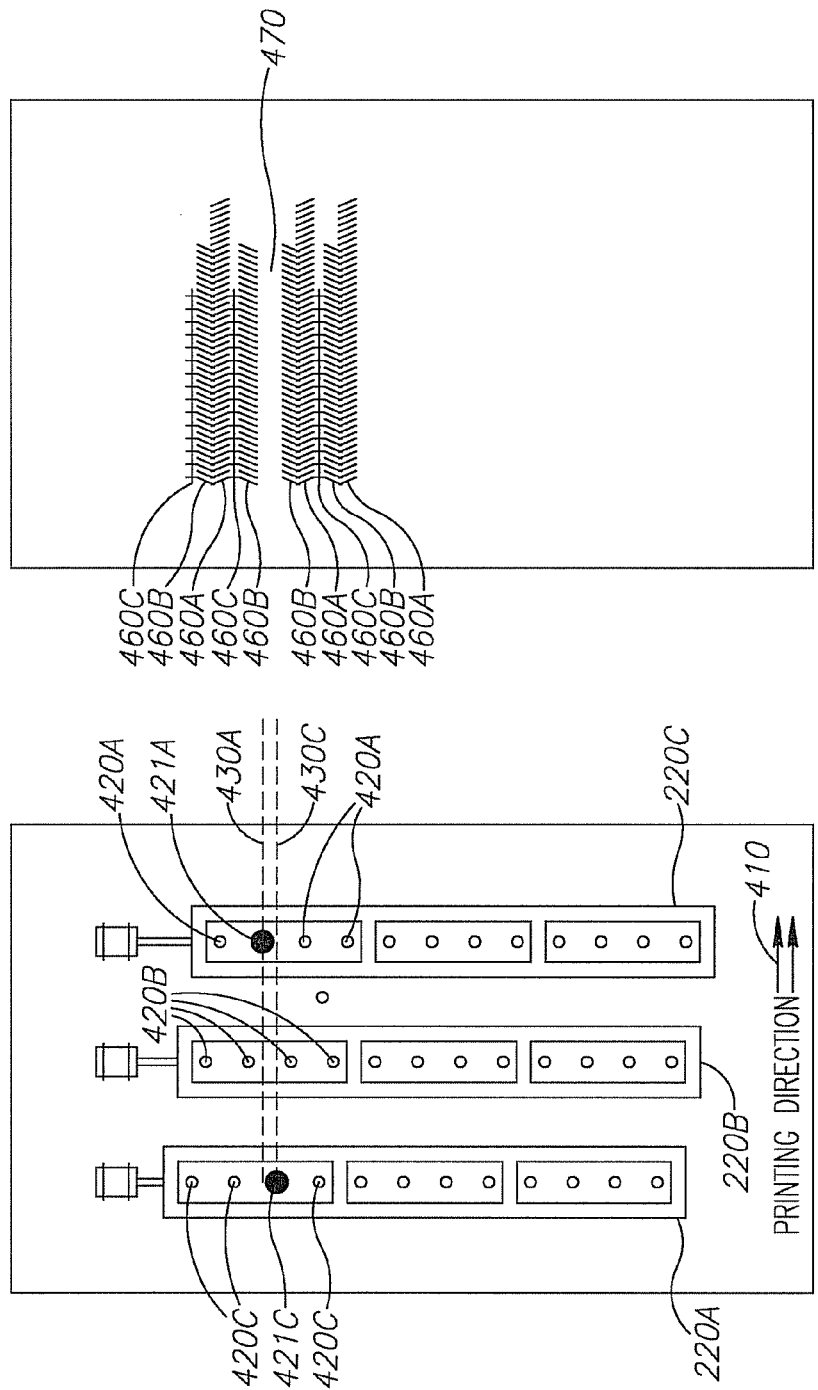

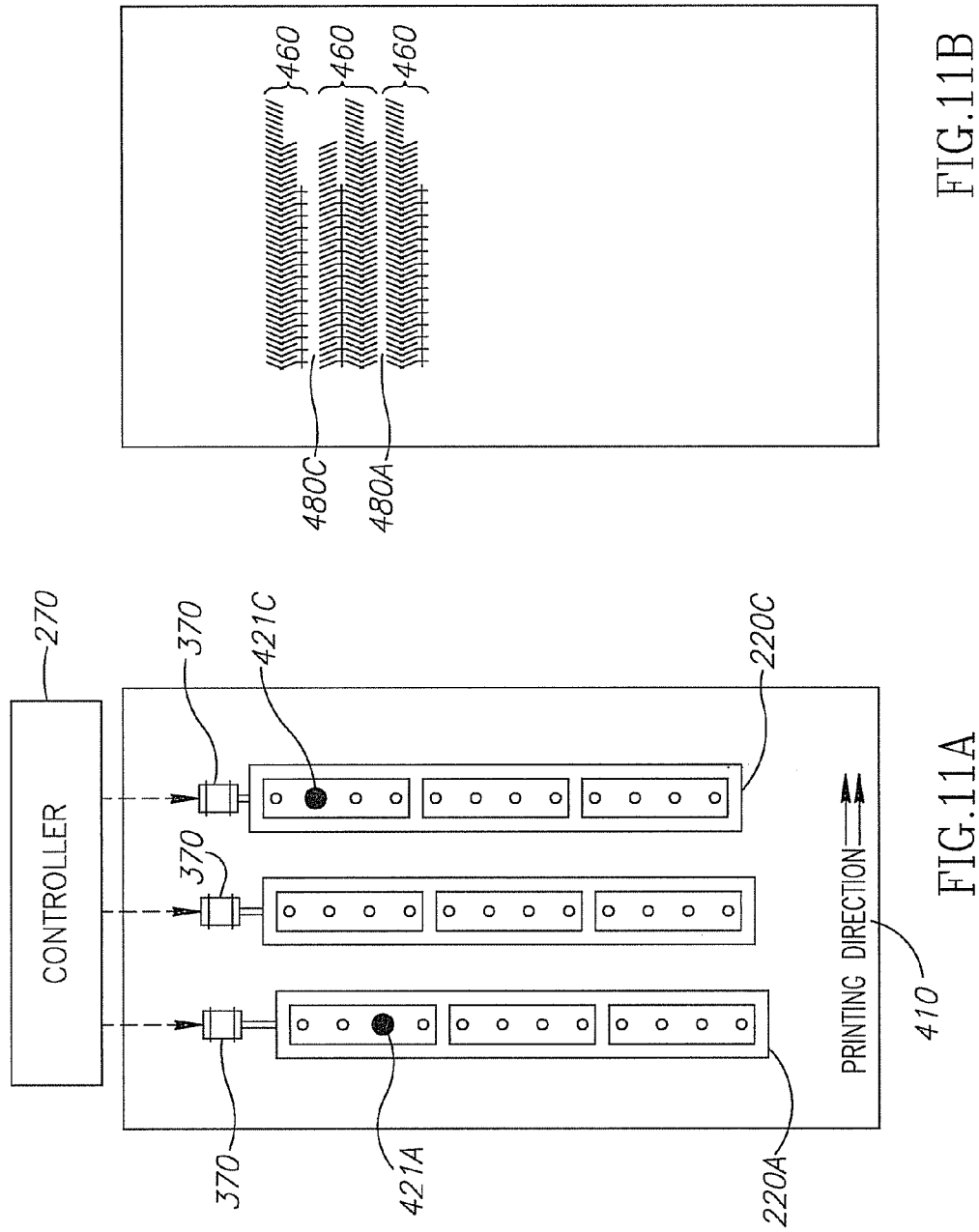

METHOD AND SYSTEM FOR NOZZLE COMPENSATION IN NON-CONTACT MATERIAL DEPOSITION

CROSS-REFERENCE TO RELATED APPLICATIONS

This application is a continuation application of U.S. patent application Ser. No. 12/487,173, filed Jun. 18, 2009, which claims benefit of U.S. provisional Application No. 61/073,889, filed on Jun. 19, 2008. The application is also a continuation-in-part application of U.S. patent application Ser. No. 12/134,294, filed on Jun. 6, 2008 (now U.S. Pat. No. 7,850,271), which is a continuation-in-part application of PCT International Application No. PCT/IL2007/001468, filed on Nov. 28, 2007, which claims priority from U.S. provisional Application No. 60/867,423, filed on Nov. 28, 2006, all of which are incorporated herein by reference in their entirety.

FIELD OF THE INVENTION

The present invention relates to printing generally and to drop on demand (DOD) inkjet printing in particular.

BACKGROUND OF THE INVENTION

Deposition printing, such as for example Drop on demand (DOD) inkjet printing or aerosol printing, is known in the art. Such printing may be typically used for low speed, low volume print jobs, such as, for example, large format digital printing for the signage market, and low quantity printing of textiles.

Reference is now made to FIGS. 1 and 2 which together illustrate a prior art one pass in-line printer system 100. System 100 comprises a conveyor 120 on which print media 10 is placed, static jetting arrays 140 which drop ink onto print media 10 and a jetting controller 150 which indicates to jetting arrays 140 when and how to print to produce a printed image 115 as per input image data 155.

One or more jetting arrays 140 may be used to print each color that may be used by a print job. One or more additional jetting arrays 140 may also be dedicated to the application of additional coatings or varnishes as required. As illustrated in FIG. 2, a jetting array 140 is organized into print units 160. The print units are static with respect to each other. Each print unit 160 consists of one or more print heads 170, and each print head 170 may have several dozen or even hundreds of nozzles 180, although for the sake of clarity, only a few are shown in FIG. 2. Multiple print heads 170 may be used together to speed up the print process and/or to print images of varying degrees of resolution.

Jetting controller 150 (FIG. 1) transmits a stream of commands to jetting arrays 140 that control the jetting of nozzles 180 in order to translate image data 155 to printed image 115. As print media 10 passes underneath jetting arrays 140, jetting arrays 140 may remain in a static position and nozzles 180 can then jet onto print media 10. Each nozzle 180 may jet thousands of drops per second during the printing process.

Nozzles 180 may suffer defects that may partially or wholly impair their effectiveness. Such nozzles may stop jetting or may jet poorly. Such defects may be of either a temporary, or a permanent nature.

DOD inkjet systems and other deposition printing systems, such as aerosol jetting printing system or a dispenser, may therefore require frequent maintenance to prevent or repair such defects, and to ensure the ongoing reliability of the dispensing heads. Such maintenance may include, for example, in the case of inkjet, purging the nozzles with liquid or air, wiping and/or brushing the nozzles and/or the orifice plate, fire jetting with the entire group of nozzles or part of them, heating or cooling the nozzles, or washing the heads with liquids. Nozzles with permanent defects may be replaced.

Typically, such maintenance may be performed several times during a printing hour. Repeated stoppage of the printing process to perform maintenance may slow down the printing process and consequently raise the cost of printing. Conversely, failure to perform timely maintenance of the nozzles may result in poorer print quality and higher equipment costs as a higher percentage of nozzles may be permanently damaged and may need to be replaced.

The most common implementation of DOD inkjets for printing applications, such as graphic arts and others, entails multiple passes over the same area. The jetting heads pass over the same area a number of times, each time with a small shift so that each nozzle jets in several slightly different locations. The resulting print area for a given nozzle may therefore be overlapped by the print area for one or more other nozzles. Since the same area is printed by more than one nozzle, these overlapping print areas may serve to mitigate the effects of a defective nozzle that jets poorly or not at all. Accordingly, the use of such multiple pass jetting with overlapping print areas may enable a system to create quality prints even with several defective nozzles. It is highly desired to have a one pass jetting system capable of compensating for defective nozzles to enable creating quality prints.

Non-contact material deposition printing is an appealing method for patterning and depositing materials in the printed electronics and solar cell industries. For example, forming conductive lines by directly depositing conductive materials on the back or front surface of the solar cell to provide a conduction path for the charge generated by the cell may increase the efficiency of the solar cell as well as the productivity of mass-manufacturing.

Deposition printing techniques, such as ink jet printing or aerosol printing involves depositing droplets of print material from nozzles by moving a print head and a substrate relative to one another along a printing direction. One of the problems associated with deposition printing is faulty nozzles that may stop jetting or may jet poorly. Accordingly, a faulty nozzle may result in uneven conductive lines which may lead to inefficient or inoperative solar cells.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

FIGS. 7, 9A, 10A, and 11A are schematic illustrations of different states of movable print units according to embodiments of the invention;

FIGS. 8, 9B, 10B, and 11B are magnified views of exemplary printouts from the print units of FIGS. 7, 9A, 10A and 11A, respectively;

Figure 1:
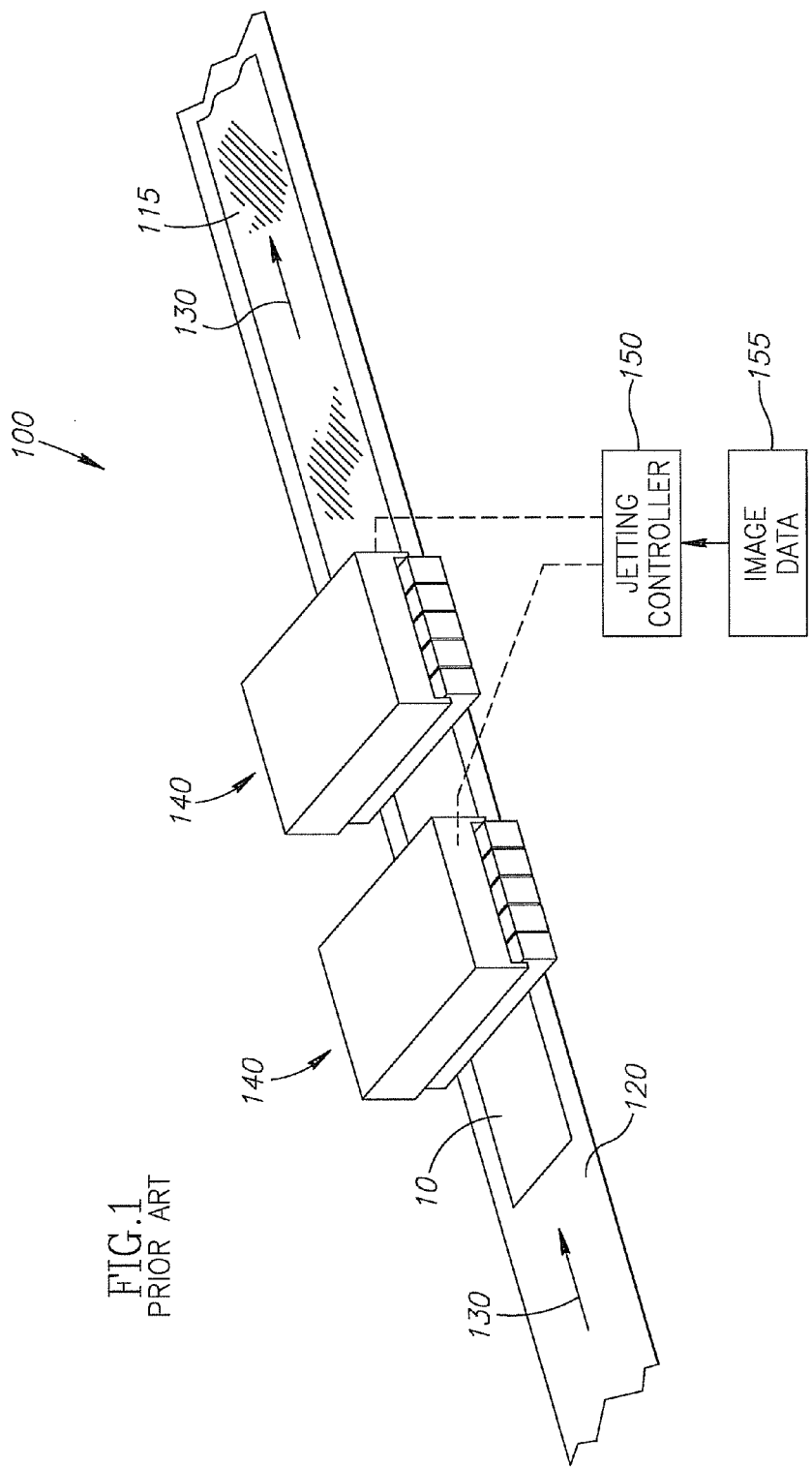
FIGS. 1 and 2 together are a schematic illustration of a prior art one pass in-line printer system 100.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE PRESENT INVENTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

Although embodiments of the invention are not limited in this regard, discussions utilizing terms such as, for example, "processing," "computing," "calculating," "determining," "establishing", "analyzing", "checking", or the like, may refer to operation(s) and/or process(es) of a computer, a computing platform, a computing system, or other electronic computing device, that manipulate and/or transform data represented as physical (e.g., electronic) quantities within the computer's registers and/or memories into other data similarly represented as physical quantities within the computer's registers and/or memories or other information storage medium that may store instructions to perform operations and/or processes.

Although embodiments of the invention are not limited in this regard, the terms "plurality" and "a plurality" as used herein may include, for example, "multiple" or "two or more". The terms "plurality" or "a plurality" may be used throughout the specification to describe two or more components, devices, elements, units, parameters, or the like.

Some embodiments of the invention are directed to a deposition printing system that includes two or more print units capable of moving with respect to each other during printing. In the description below a demonstrative embodiment of an inkjet printing system is illustrated. It should be, however, understood to a person skill in the art that embodiments of the invention are not limited in this respect and other suitable deposition printing systems may be used, such as, an aerosol printing system, a dispenser and others.

Figure 3:
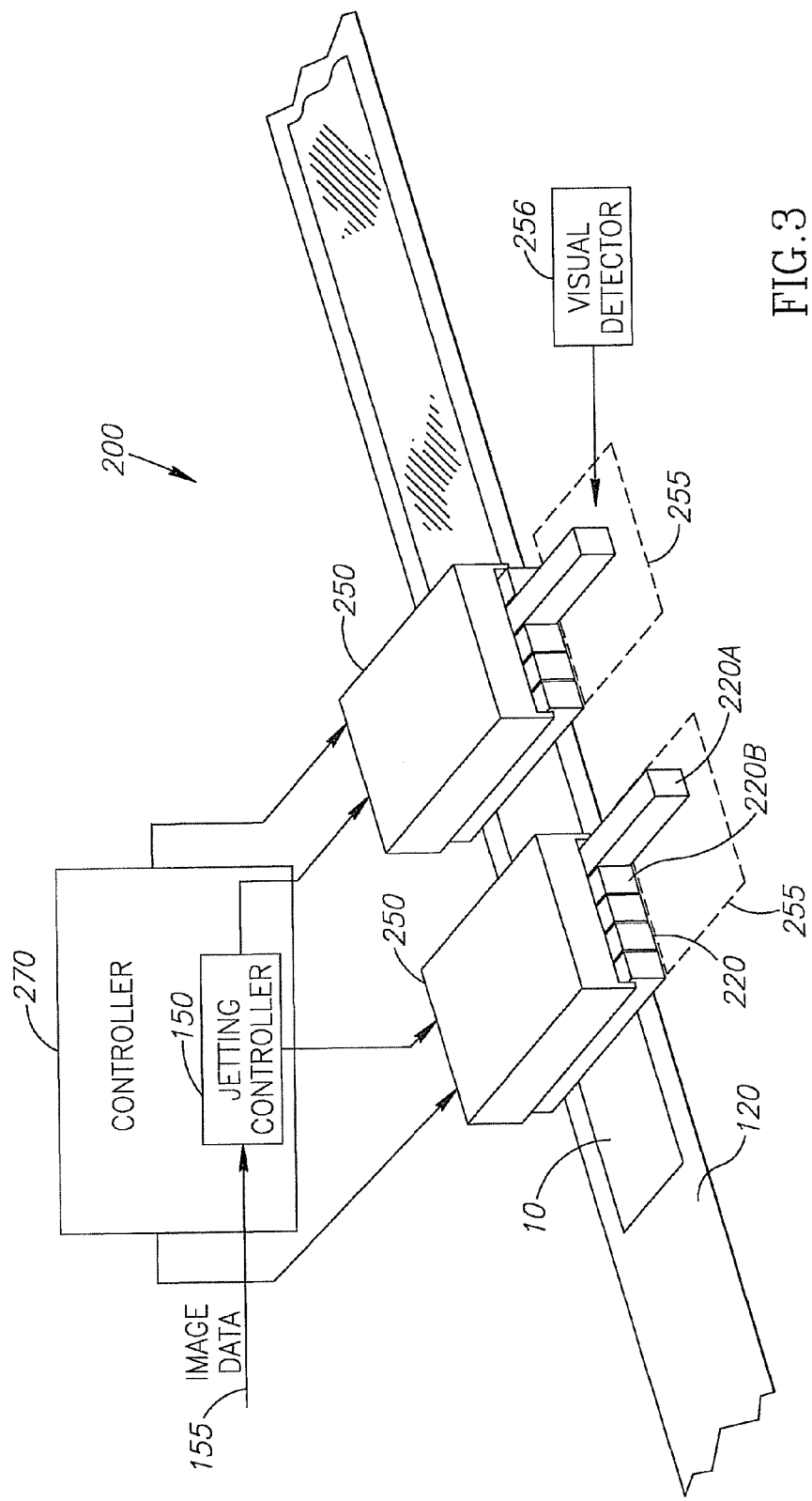
FIGS. 3 and 4 together are a schematic illustration of an exemplary printing system according to embodiments of the present invention.
Figure 4:
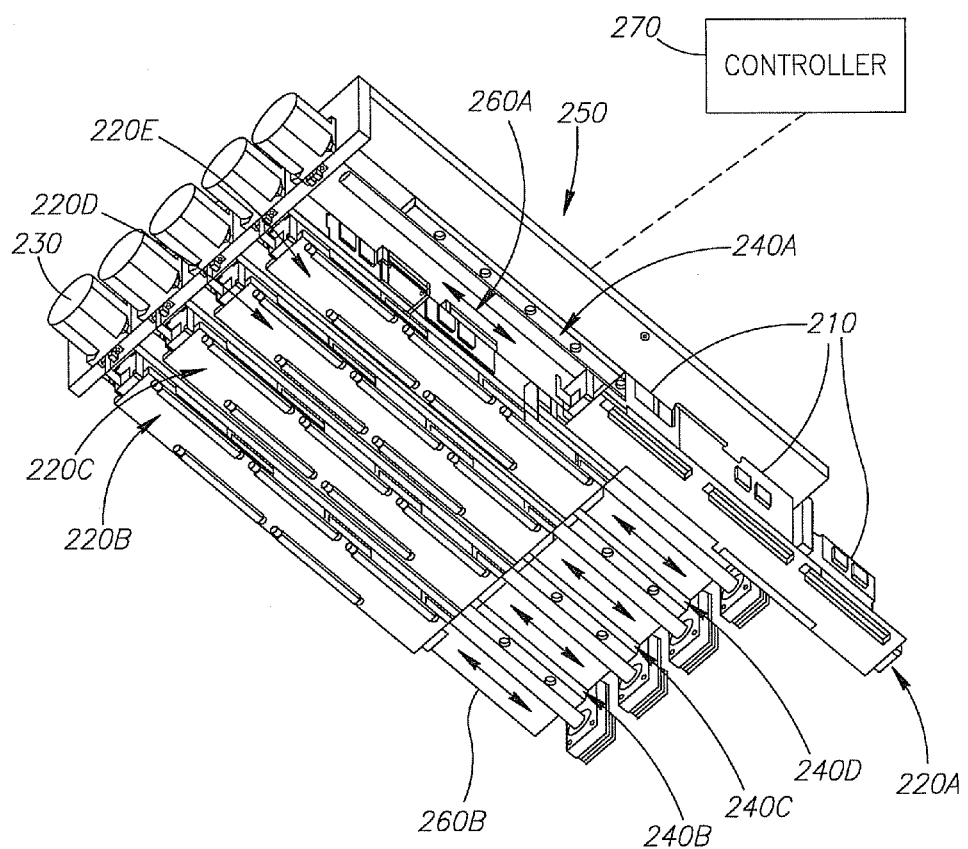

Reference is now made to FIGS. 3 and 4, which together illustrate an exemplary inkjet printing system 200 according to embodiments of the invention. System 200 is capable of executing continuous high speed, high volume print jobs without frequently stopping for maintenance. Similar reference numerals refer to similar units.

Printing system 200 may include conveyor 120, defining the width of a print area, on which print media 10 is placed, one or more jetting array housings 250 laterally positioned in fixed positions facing conveyor 120, a controller 270 to control the printing process and one or more maintenance stations 255. Each housing 250 may have a designated maintenance station 255 that may be set in close proximity to its associated jetting array alongside conveyor 120. Printing system 200 may further include a visual detector 256, such as camera or charge coupled device (CCD) coupled to controller 270 and positioned in proximity to maintenance station 255 to inspect the status and condition of nozzles of print units located at the maintenance area. Any other suitable visual detector capable of inspecting the nozzles may be used.

Printing system 200 may include, attached to each jetting array housing, two or more movable print units 220 capable of moving with respect to each other during printing. Print heads 220 may move in a direction substantially perpendicular to the print direction represented by the direction of advance of conveyer 120. Each of the print units may include one or more print heads located in fixed positions within the movable print unit. The relative positioning of the print units with respect to each other form particular head arrangement capable of being dynamically changed during printing (on the fly).

For a given head arrangement, the desired functionality of each of print units 220 may be determined by controller 270. For example, print unit 220A may be designated as an idle print unit to indicate that the print unit temporarily does not actively jet participate and can move to the maintenance area. The remaining print units, 220B-220E may be designated as active print units to indicate that they are currently involved in printing, namely, at least one of their nozzles may jet according to the image data. According to embodiments of the invention, one or more of print units, for example unit 220D may be designated as compensating print unit having the role of compensating for defect nozzles belonging to at least another print unit, for example 220C. Therefore, both print units 220D and 220C print wherein print unit 220C jets from its nozzles according to the image data excluding the defective nozzles and print unit 220D jets only from nozzles that may replace the defective nozzles of print unit 220D.

Although print units 220A-220D are described as associated with an inkjet printing system, it should be, however, understood to a person skilled in the art that embodiments of the invention are not limited in this respect and the print units according to other embodiments of the invention may be associated with other suitable deposition printing systems, such as an aerosol printing system or a dispenser.

It should be understood to a person skilled in the art that, over time, each print unit 220 may be designated as either "active", "idle" or "compensating", according to its current functionality. According to embodiments of the invention, the timing of the role changing of the print units is determined so as to maintain substantially even distribution of workload between the print units. Further, according to embodiments of the invention, in order to maintain substantially even distribution of workload between nozzles within one print unit, the print unit may be moved, from time to time, with respect to other print units to enable activation of previously inactive nozzles.

According to an exemplary embodiment of the invention, each print unit 220 may include four print heads, each having 192 nozzles. It should be understood however to a person skilled in the art that the invention is not limited to such an arrangement and according to embodiments of the invention, any suitable numbers of print heads and nozzles are applicable.

Controller 270 may dictate the movement of various movable print units 220, with respect to each other, within and without the print area, to their associated maintenance stations. Controller 270 may control movement of the print units to dynamically change the head arrangement during the printing.

In accordance with embodiments of the present invention, controller 270 may track the maintenance schedule of movable print units 220. When a movable print unit, here labeled 220A, requires maintenance, controller 270 may determine the current status functionality of the unit to be idle and instruct a motor unit 230 coupled to print unit 220A to move to its maintenance station 255. Since maintenance stations 255 are generally located alongside conveyor 120, printing system 200 may continue to print while movable print unit 220A undergoes maintenance.

As illustrated in FIG. 4, movable print units 220 are located in jetting array housing 230 and may be moved along sliders 240. Such movement may extend most of each movable print unit 220 beyond the extent of jetting array housing 230 to maintenance station 255. It will be appreciated that maintenance stations 255 are located outside of a print area as defined by the area underneath "active" movable print units 220.

Figure 5:
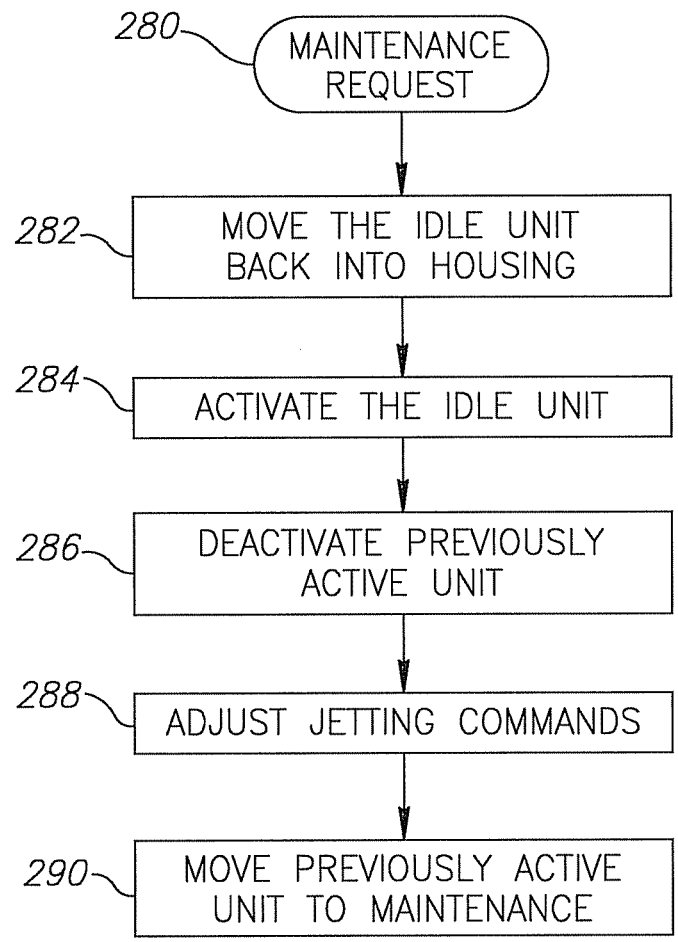
FIG. 5 is a flow chart illustration of an operating method according to embodiments of the present invention.

Reference is now made to FIG. 5 which illustrates a method according to embodiments of the invention by which system 200 may perform maintenance while continuing to print. As shown in FIG. 5, when, for example, movable print unit 220B requires maintenance (step 280), controller 270 may issue (step 282) a command to another movable unit 220A, which may be idle at the time, to slide back into jetting array housing 230. Controller 270 may then designate movable print unit 220A as active (step 284) and movable print unit 220B may then be designated the idle print unit (step 286) and. may then adjust the jetting commands (step 288) based on the change in status of movable print units 220A and 220B. The jetting commands are adjusted due to the fact that the physical location of movable print unit 220A differs from the physical location occupied by movable print unit 220B. Controller 270 may then wait for a cycle where movable print unit 220B may not be in actual use before issuing (step 290) a command to movable print unit 220B to move along slider 240B (arrow 260B) to maintenance station 255.

While in maintenance station 255, print heads 210 in movable print unit 220 may undergo various maintenance procedures including, for example, purging the nozzles with liquid or air, wiping and/or brushing the nozzles and/or the orifice plate, fire jetting with the entire group of nozzles or part of them, heating or cooling the nozzles, or washing the heads with liquids. Nozzles with permanent defects may also be replaced. The print unit may be inspected prior to performing the maintenance operations using manual inspection or automatic inspection using detector 256. According to embodiments of the invention, based on the inspection result, it may be determined if the print unit require maintenance and if so what maintenance operations to perform.

After maintenance is completed, movable print unit 220 may be examined. This examination may be an automated procedure using detector 256 and/or may employ a manual operator. The examination may also include a visual inspection of the movable print unit 220 and print heads 210. A test print may be performed and the measurement of the resulting drop shapes and weights may be checked using either manual procedures or automated test equipment. Various characteristics of movable print unit 220 may also be measured, including, for example, temperature, electronic pulses and/or pulse shapes. The registration and alignment of print heads 210 may also be measured.

The examination results may then be analyzed to detect, for example, missing nozzles, weak nozzles, crooked nozzles, a drop volume that is not proper, and/or misalignment of print heads 210. Depending on the errors detected, another maintenance session may be required, one or more print heads 210 may be replaced, and/or printing may continue with movable print unit 220. It may be possible to compensate for some defects by using jetting controller 150 to adjust the printing parameters for the affected print head 210. Such parameters may include, for example, jetting pulse, shape, amplitude and/or temperature.

After analysis of the examination results and adjustment of any parameters as needed, the idle movable print unit 220 may then be available to replace another movable print unit 220 due for maintenance.

It will be appreciated that there may be more than one idle movable print unit 220 in a given head arrangement. The number of "idle" and "active" movable print units 220 may be configured in accordance with an operator's requirements for speed, resolution, and frequency of maintenance.

Figure 6A:
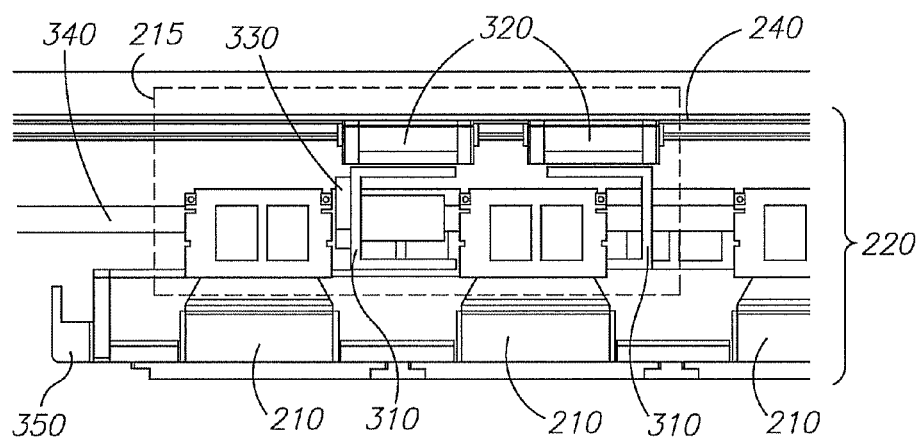
FIG. 6A is a cross-sectional view of movable print unit according to exemplary embodiments the present invention.

Reference is now made to FIG. 6A which is a cross-sectional view of one movable print unit 220. Movable print unit 220 may comprise print heads 210, a translation apparatus 215 and slider 240. Translation apparatus 215 may comprise connecting brackets 310, slider guide carriages 320, a lead screw driving nut 330, and a lead screw 340.

Slider guide carriages 320 may straddle slider 240, and movable print unit 220 may be connected to slider guide carriages 320 via connecting brackets 310. Lead screw driving nut 330 may also be affixed to movable print unit 220 via connecting brackets 310. Lead screw 340 may run through lead screw driving nut 330 such that, when lead screw 340 turns, movable print unit 220 may move along slider 240.

Figure 6B:
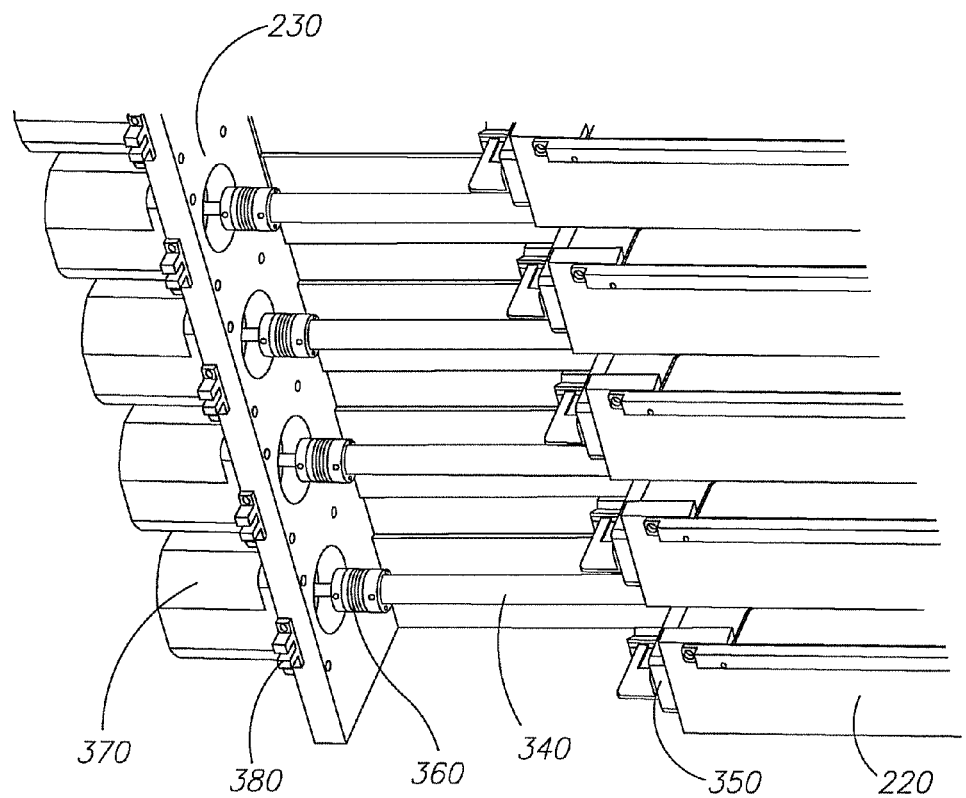
FIG. 6B is a schematic illustration of a close-up view of a portion of an exemplary printing system according to embodiments of the present invention.

Reference is now made to FIG. 6B, which illustrates a close-up view of portion of a printing system, the "home position area", according to embodiments of the present invention. The home position area may include, for example, lead screws 340, home flags 350 (attached to movable print units 220), couplings 360, stepper motors 370, home position sensors 380 and configurable jetting array housing 230.

Home flags 350 may be used to determine whether or not movable print units 220 may be in their home position. As such, home position sensors 380 may be mounted on jetting array housing 230, opposite home flags 350 which are attached to the end of movable print units 220. When, for example, system 200 is powered up, movable print units 220 may be moved to a home position, such that home flag 350 may be sensed by home position sensor 380. Home position sensors 380 may be, for example, optical or electrical proximity sensors.

Controller 270 may then register each movable print unit 220 as being in the home position. When movable print unit 220 may be designated for movement, for example to the maintenance area, stepper motor 370 may be used to turn lead screw 340. Controller 270 may then track the new position of print units 220 by calculating the offset defined by the difference between the home position and the movement generated by stepper motor 370.

According to embodiments of the invention, the positions of the print unit, both the initial positions relative to each other and the changes in the positions of the units in the print area during printing may be determined by performing an optimization calculation. The optimization calculation may be stochastic calculation based on image data and/or nozzle status data. For example, based on the knowledge that a particular nozzle of a particular print unit is defective and that a potion of the image is blank, the optimization calculation may assign the print head having the most defective nozzles to be positioned above the area that is not to be printed.

It will be appreciated that as described herein above, printing system 200 may provide continuous DOD one pass printing without frequent stoppages for maintenance.

In an alternate embodiment of the present invention, printing system 200 may not be configured for one pass printing. For example, printing system 200 may be configured for web printing or multiple pass printing.

Applicants have realized that movable print units 220 may be configured to increase the speed of a print job or alternatively to increase the resolution by multiple-layer printing. Accordingly, in some embodiments of the present invention, printing system 200 may be configured to print with higher speeds.

Figure 8:
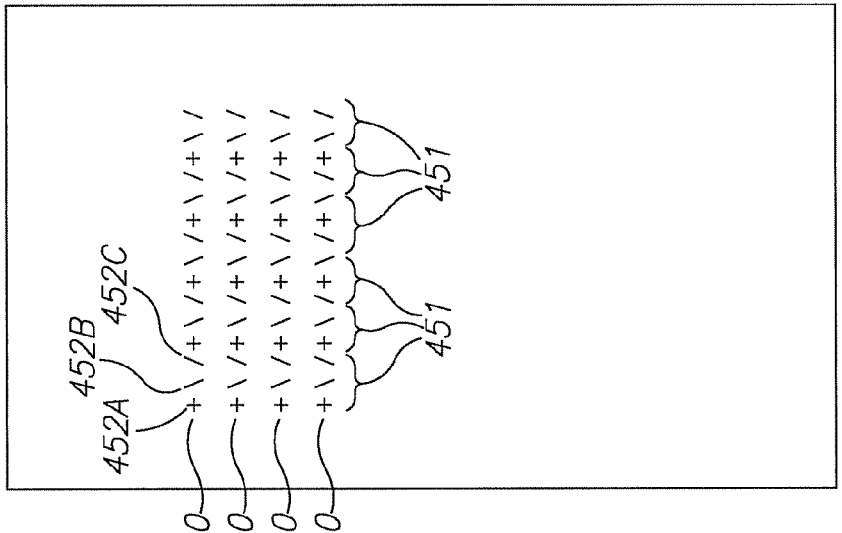
Figure 7:
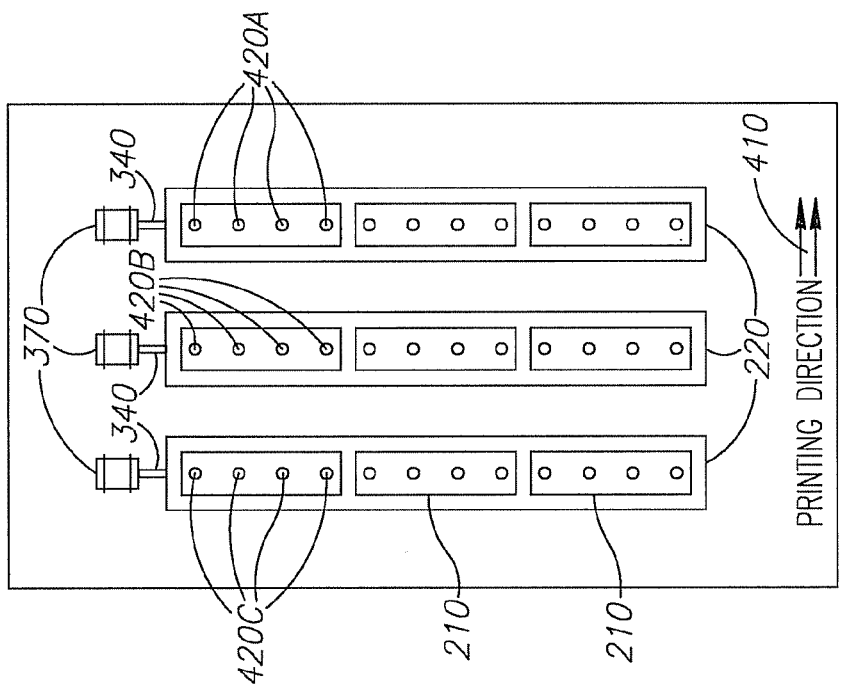

Reference is now made to FIG. 7, which illustrates the active movable print units 220 in an exemplary print head arrangement. Each print head 210 may have several dozen or even hundreds of nozzles 420, although for the sake of clarity, only a few are shown in FIG. 7. Reference is also made to FIG. 8, which illustrates a magnified view of an exemplary printout from such a print head arrangement. FIG. 7 also shows stepper motors 370 and lead screws 340 which may control the movement of movable print units 220. As in the previous embodiments, similar reference numerals refer to similar units.

It will be appreciated that all movable print units 220 in FIG. 7 may be configured in precise alignment, such that they may occupy parallel positions along the same print axis when printing in a printing direction 410. In FIG. 8, output lines 460 represent the combined print output from nozzles 420. Output from nozzles 420A is represented as "/"; output from nozzles 420B is represented as "\"; and output from nozzles 420C is represented as "+".

Such an alignment may enable printing system 200 to print at a higher speed. Since nozzles 420A, 420B and 420C may each respectively jet over the same location, controller 270 may instruct nozzles 420 to print simultaneously in mutually exclusive contiguous print areas using interlacing printing.

FIG. 8 illustrates the results of such instruction. Each print line 460 comprises a repeating pattern of output 451 from nozzles 420A, 420B, and 420C. Each respective pattern of output 451 is comprised of three nozzle outputs 452, representing the output from nozzles 420A, 420B and 420C. It will be appreciated that since nozzles 420A, 420B and 420C may print simultaneously, the time required to print each respective pattern of output 451 may be equal to the time required for each respective nozzle 420. Accordingly, it will be appreciated that in such a configuration printing system 200 may print at a speed which is three times as fast.

It will further be appreciated, that such an alignment where each line is printed by several different nozzles, may improve print quality and result in better image quality As each line of output may be printed by a multiplicity of nozzles 420, the effect of a given missing or defective nozzle 420 may be less noticeable since other nozzles 420 may also be printing on the same line.

It will further be appreciated, that such an alignment where each line is printed by several different nozzles may increase print resolution and material per dot throughput and may enable multiple-layer printing. According to some embodiments of the invention, controller 270 may instruct nozzles 420A, 420B and 420C to jet consecutively over the same location so as to increase the amount of material per dot by three.

Figure 2:
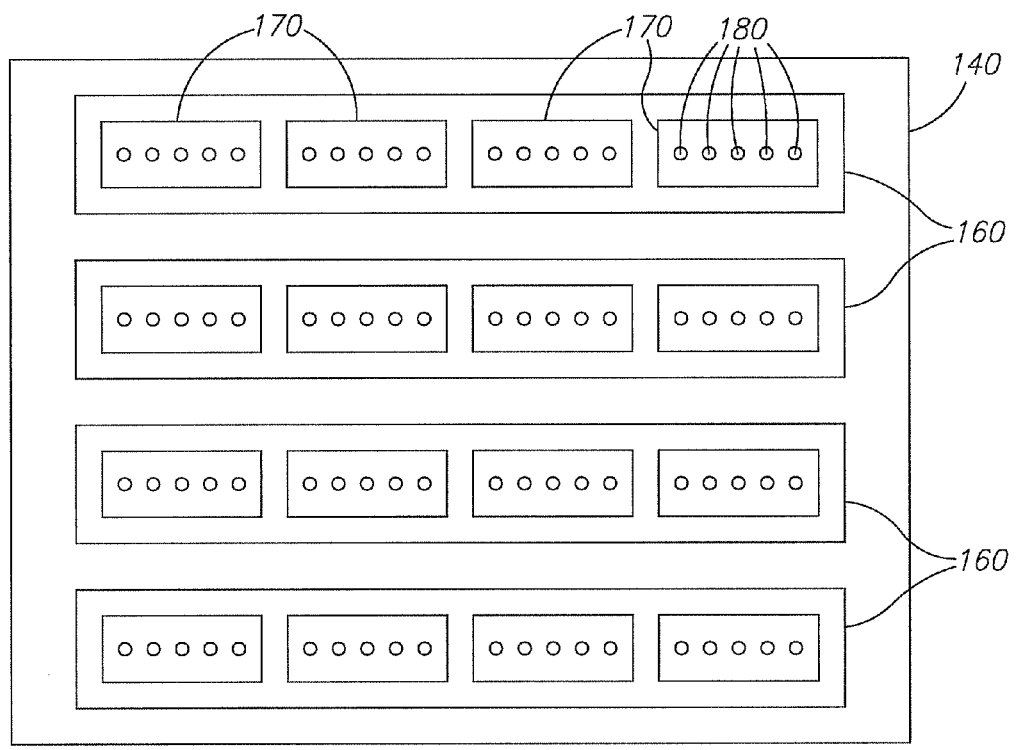

In a typical DOD printing system (such as in FIGS. 1 and 2), it is not uncommon that the nozzles on a given print head may print in slightly different strengths. This may be caused by a combination of circumstances, including, for example, the distance from the ink source to a nozzle; temperature variances within the print head; dust and impurities in the print head; and defects caused by extended use. It will be appreciated that such differences may also exist when comparing the relative strength of nozzle output from different print heads and movable print units 220.

It will therefore be appreciated that the exemplary print out illustrated in FIG. 8 may not be of a uniform and consistent strength. For many print jobs this level of print quality may be acceptable. However, there may be print jobs, for example when printing a uniform color background when a more homogeneous output is required. According to embodiments of the present invention, controller 270 may finely adjust the location of movable print units 220 within jetting array housing 230 to enable a homogeneous coverage of the print area for a desired resolution.

Reference is now made to FIG. 9A which shows an exemplary head arrangement configured according to embodiments of the invention in such a manner as to provide a more complete and homogeneous coverage of the print area. Movable print units 220A, 220B and 220C may each include three print heads 211, 212 and 213. Reference is also made to FIG. 9B which represents an exemplary printed output from such an head arrangement. Similar reference numerals refer to similar units.

It may be unlikely that that all nozzles 420 have the same jetting strength. For example, nozzles 420A on movable print unit 220A may generally jet more weakly than nozzles 420B on movable print unit 220B, or print heads 212 may generally jet more weakly than print heads 211 and 213. There may even be variances of jetting strength among the different nozzles 420 in the same print head 211, 212 or 213. Controller 270 may use data regarding the relative strengths of nozzles 420 to determine a homogenized print head arrangement for movable print units 220. The homogenized print head arrangement may be determined by stochastic optimization calculations. The data may be delivered to controller 270 from visual detector 256 or from other sources.

Based on such homogenized print configuration, controller 270 may instruct stepper motors 370 to move print units 220 within the print area. As in the previous embodiments, motors 370, for example stepper motors, may move movable print units 220 by turning lead screws 340. However, according to embodiments of the present invention, such movement may be in very small increments. In such a manner, the active movable print units 220 may be staggered slightly in generally equidistant increments over the print area. Accordingly, when printing in printing direction 410, the nozzles 420 for each print unit 220 may not be aligned along identical print axes with the associated nozzles 420 of the other print units 220.

As shown in FIG. 9B, print lines 460A, 460B, 460C may now each be located on slightly different print axes, such that there may now be three times as many effective print lines 460 when compared, for example, to the previous embodiment of FIG. 8. It will be appreciated that, depending on the number and density of nozzles 420, the effective print axes may now be contiguous or even overlapping, such that a given print area will typically be covered by multiple nozzles 420 from more than one movable unit 220. Furthermore, such print areas may now be covered by nozzles 420 from multiple print heads 211, 212 and 213 with varying jetting strengths. Accordingly, it will be appreciated that for a given combination of print conditions, the overall coverage of the print area may be more homogenous when movable print units are staggered over the print area.

According to embodiments of the present invention, the print head arrangement may be adjusted to compensate for missing or defective nozzles 420.

As described hereinabove, after movable print units 220 undergo maintenance, they may then be examined and/or tested to detect persistent defects that may not have been remedied by the maintenance session. It is expected that some nozzles 420 may have such persistent defects after maintenance is performed. In such cases, movable print units 220 may be submitted for another maintenance session, or may have some of its component parts replaced. It is also possible that the entire movable print unit may need to be replaced. According to embodiments of the invention, detector may send an alert to controller 270 notifying that a replacement of one or more print heads is needed. It may also be expected that some movable print units 220, with relatively few missing or defective nozzles 420, may be returned to "active" status even though their use may affect the quality of the print job.

According to embodiments of the present invention, one of print units 220 may be designated as a replacement unit (RU) or compensating unit for missing and/or defective nozzles 420 of another print unit 220. If one or more nozzles 420 are detected as missing or defective in a movable print unit 220, RU may be moved and located in position to provide jetting action in place of the missing and/or defective nozzles 420.

FIGS. 10A and 10B, to which reference is now made, together illustrate possible effects of a given alignment of movable print units 220 on the quality of output lines 460. Movable print units 220 may have a number of defective nozzles 421 that may have been identified in a previous maintenance session. For example, defective nozzle 421A may be located on movable print unit 220A, and defective nozzle 421C may be located on movable print unit 220C. Print axes 430A and 430C may represent the print path of nozzles 421A and 421C when printing in a print direction 410. Similar reference numerals refer to similar units.

As shown in FIG. 10A, the location of defective nozzle 421A may dictate a print axis 430A, and the location of defective nozzle 421C may dictate a print axis 430C. Accordingly, while defective nozzles 421A and 421C may be located on different movable print units 220, they may be assigned to jet on contiguous or overlapping print axes. FIG. 10B shows the results of such printing. A noticeable gap 470 appears among the lines of printed output 460 where defective nozzles 421A and 421C were supposed to have jetted.

Reference is now made to FIG. 11A which shows the print units configured in a particular print head arrangement as to compensate for the existence of defective nozzles 421A and 421C in movable print units 220A and 220C, respectively. Reference is also made to FIG. 11B which represents an exemplary printed output from such a print head arrangement. Gaps 480A and 480C appear among printed lines 460. Similar reference numerals refer to similar units.

Controller 270 may instruct stepper motors 370 to move print unit 220C slightly in order to provide distance between the print axes 430 of defective nozzles 421A and 421C respectively. According to embodiments of the invention, controller 270 may determine the desired head arrangement based on stochastic optimization calculations taking into consideration the nozzle status data. According to some embodiments, the optimization calculation may further be based on the specific image data. It will be appreciated that other print units 220, for example unit 220A, may also be moved as needed.

In the resulting exemplary print head arrangement, movable print unit 220C has moved to a new position, thus creating distance between the print axes 430C and 430A of defective nozzles 421C and 421A when printing along print direction 410. As shown in FIG. 11B, two smaller gaps 480C and 480A are shown among printed lines 460.

It will be appreciated that smaller gaps 480C and 480A may be less noticeable than gap 470 and may be invisible to the naked eye. It will further be appreciated, that movable print units 220 may be configured in such a manner that printed characters 460 may be on overlapping print axes. In such print head arrangements, gaps 480A and 480C may be eliminated in part or in entirety as other nozzles 420 may jet on the print area nominally covered by defective nozzles 421.

According to embodiments of the present invention, movable print units 220 may also be configured in such a manner as to more efficiently print a printed image with variable widths. This may be facilitated by extending and/or retracting movable print units 220 over a wider print area before and/or during the course of a print job.

Figure 12A:
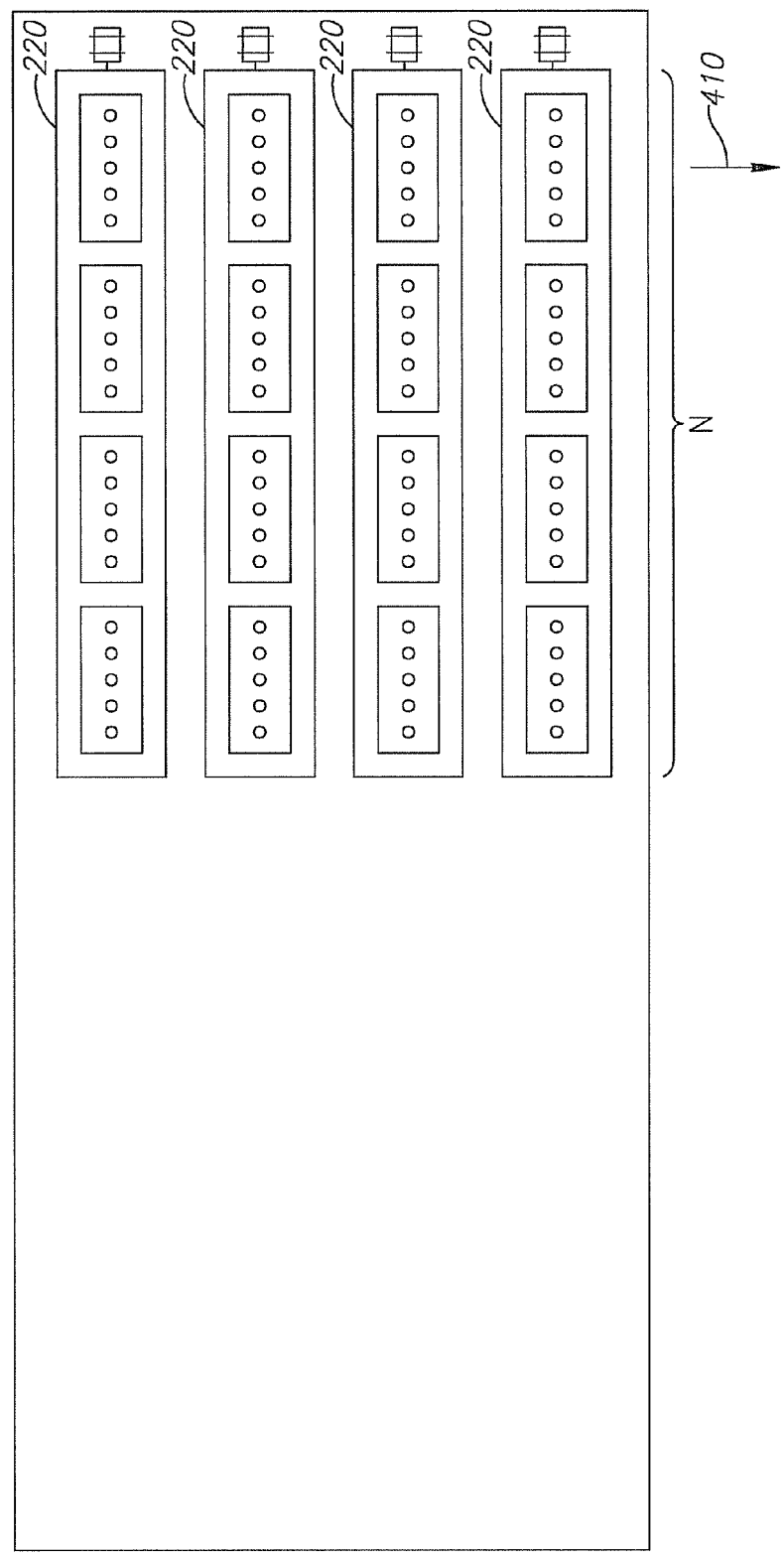
FIGS. 12A and 12B together illustrate a method of printing with variable widths during the course of a print job according to embodiments of the invention.
Figure 12B:
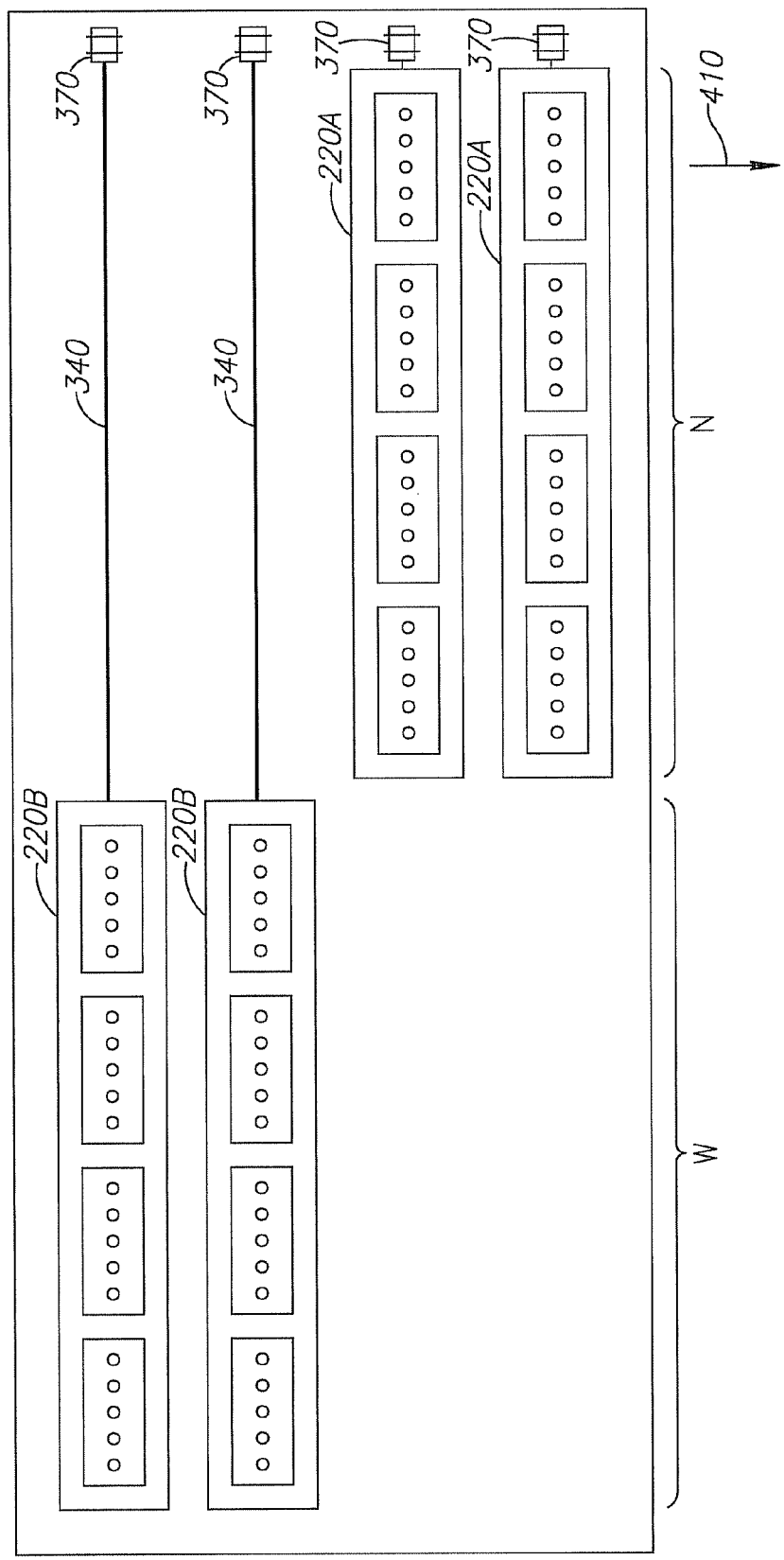

Reference is now made to FIGS. 12A and 12B which together illustrate how movable print units 220 may be moved to print with variable widths during printing. As shown in FIG. 12A, printing unit 200 may comprise a multiplicity of movable print units 220 configured in parallel to print in a narrow print area "N" in a direction 410. It will be appreciated that, as described hereinabove, such a configuration may be used, for example, to increase the speed or resolution of a print job.

However, such a configuration may not be sufficiently wide to print a wider print area. For such cases, it may be necessary to move print units 220 into a new print head arrangement as shown in FIG. 12B. Stepper motors 370 may extend lead screws 340, thus moving movable print units 220B, as required, to provide coverage for additional print area "W".

It will be appreciated that movable print units 220A may remain in place and continue printing in print area N. However, such printing may now be at a lower speed, or alternatively, the resolution may be lower.

It will also be appreciated that movable print units 220B may be retracted and returned to their original locations (as shown in FIG. 12A) for subsequent ports of the print job that do not require wider print coverage. The print speed and/or resolution may then be adjusted accordingly.

It will further be appreciated that the configurations in FIGS. 12A and 12B are exemplary. Other configurations may also be used. For example, N and W may be of different widths. Furthermore, non symmetric configurations may be used to print areas N and W with different resolutions, and staggered non parallel movable print units 220 may be used instead of the generally parallel units 220 shown in FIGS. 12A and 12B.

Embodiments of the invention may be applicable to a variety of printing systems and methods. For the sake of clarity and simplicity exemplary embodiments and references of non-contact material deposition systems will mostly be for the application of fabrication of conducting metal lines for solar cells using an inkjet system. However, the scope of the invention is not limited by such exemplary embodiments and may be applied to other deposition systems, such an aerosol jet deposition system or a dispenser and to other applications, such as graphics, press, mass media, packaging, electronics and others.

Embodiments of the invention are directed to a system and method for inspection of print nozzles while a print process or a print job is in progress and replacing actively printing nozzles as needed. According to embodiments, the system may comprise redundant print heads or printing units such that the number of print heads may be higher than the number of print head required to perform a desired printing task. At any given time during printing a portion of the heads may be active while the remaining print head may be redundant heads.

According, while a print process is in progress, a first subset selected from a plurality of print heads installed in a system would be designated to deposit material on a substrate, a second, different subset of print heads may be subjected to, or undergo a maintenance procedure. For example, while a first print head is actively depositing material on a substrate, a second print head may be relocated from a printing area or zone to an inspection, service or maintenance area. While the second print head is being inspected, serviced, repaired or otherwise subjected to a maintenance procedure, the first print head may continue to print and/or deposit material.

In some embodiments, the method may include printing lines on a substrate, for example printing contact lines on a semiconductor wafer by depositing material from a printing unit having nozzles arranged in one or more rows. According to embodiments, the printing unit may comprise redundant nozzles. The number of nozzles in a printing unit may be larger than the number of nozzles needed to accomplish a desired printing task, for example printing a line at a desired resolution. At any given time during printing a portion of the nozzles within a printing unit may be active while the remaining nozzles may be redundant or inactive. The printing is done only by nozzles designated as active nozzles while the remaining nozzles are designated as inactive nozzles. Within a particular row, material may be selectively deposited The method may further include moving the printing unit to an inspection zone while continuing the printing with active nozzles of another printing unit, which may perform the tasks of the former printing unit. In the inspection zone the nozzles are inspected and one of the active nozzles may be identified as a faulty nozzle. According to some embodiments, the inspection may be done at the printing zone without moving the printing unit to the inspection zone.

Then, the identified faulty nozzle may be designated as inactive and one of the previously designated as inactive nozzles may become an active nozzle to replace the faulty nozzle. The method may further include moving the printing unit back from the inspection zone to the printing zone and continue printing with that unit such that the new active nozzle would replace the faulty nozzle.

According to embodiments of the invention, after all the nozzles are inspected in the inspection zone or the printing zone, the system may analyze the inspection data and may choose a best set of nozzles to be the active nozzles based on predetermined considerations. Then, the chosen nozzles may be designated or specified as active nozzles while the remaining nozzles of the printing unit would be designated as inactive. Determining the best set of nozzles may be based on a required droplet size, stability of jetting and/or choosing nozzles having substantially similar deviation of their jetting direction from a normal to the nozzle plate (orifice plate). Other parameters may be taken into consideration for choosing the best set of nozzles without departing from the scope of the invention.

Figure 13:
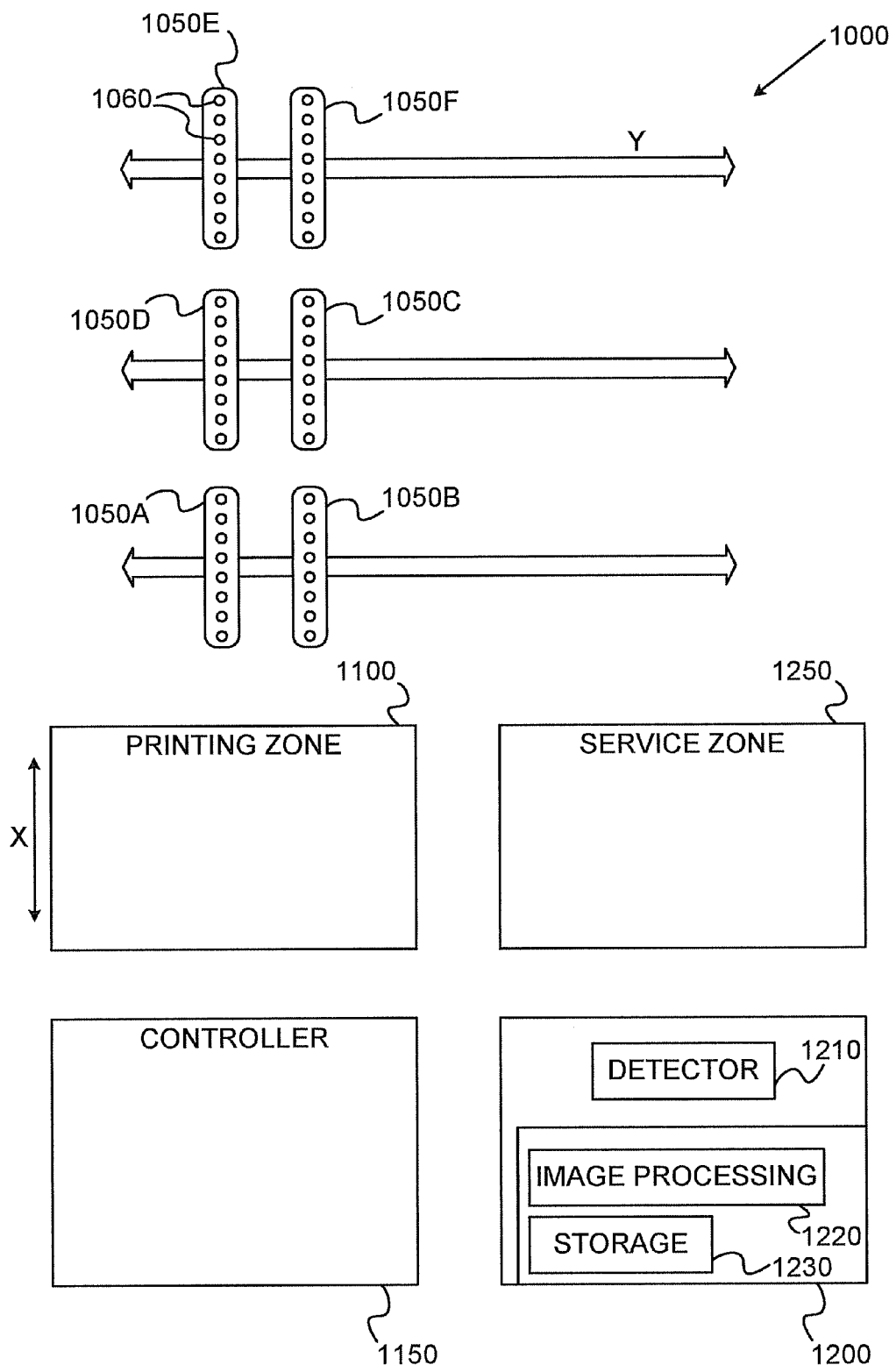
FIG. 13 shows an exemplary printing system according to embodiments of the invention.

Reference is made to FIG. 13 showing a high-level block diagram of an exemplary printing system according to exemplary embodiments of the invention. The exemplary system, denoted system 1000 may be capable of executing continuous high speed, high volume print jobs without frequently stopping for maintenance or inspection. It will be noted that system 1000 may be applicable to a variety of printing systems, e.g., inkjet or aerosol dispensing systems. System 1000 may include printing units or print heads 1050A-1050F, a printing zone 1100, such as a conveyor or platform (not shown) defining the width of a print area, on which print media, such as semiconductor wafers may be placed and a service zone 1250, in which maintenance and inspection of the printing units and their nozzles may take place.

Service zone 1250 may include one or more maintenance stations to perform various maintenance operations to the printing units. Although only six exemplary printing units are shown, any applicable number of printing units may be used without departing from the scope of the invention. The number of printing units is determined such that at least one printing unit is redundant. The redundancy enables the simultaneous inspection of non-active nozzles when active nozzles continue with the printing process. Accordingly, at least one printing unit from units 1050A-1050F may be capable of independently moving between printing zone 1100 and service zone 1250 while the other printing units remain at the printing zone and continue with the printing process. Service zone 1250 may be near or in close proximity to printing zone 1100. According to some embodiments of the invention, printing units 1050A-F may be mounted on rails such that they may be moved from printing zone 1100 to service zone 1250. Any other transport units or mechanisms may be used without departing from the scope of the invention.

Each printing unit 1050A-F may comprise nozzles 1060 arranged in one or more rows. In the exemplary illustration of FIG. 13, each row has eight nozzles arranged in parallel to the printing or scanning direction X. However, it will be appreciated by those skilled in the art that each tow may include tens or hundreds of nozzles. Each row may include redundant nozzles for substitution of faulty nozzles upon detection. A faulty nozzle may be, for example, a clogged nozzle that cannot jet any material, a weak or partially clogged nozzle that can jet only a portion from the desired amount of material or a nozzle that jet in a direction that strongly deviates from the direction of jetting of the majority of the nozzles.

Printing units 1050A-C may be positioned in proximity to printing zone 1100 such that the rows would be parallel to the print direction X. If the substrate in moved by a conveyor, the printing direction may be represented by the direction of advance of the substrate. In such a configuration, each row may print a single metallization line in a direction parallel to the print direction in one scan. Other setups or configurations of the printing unit with respect to the print direction are possible according to other embodiments of the invention.

System 1000 may further include a controller 1150 to control the printing process and an image acquisition unit 1200 coupled to controller 1150. According to embodiments of the invention, controller 1150 may perform, or be involved in, tasks or functions such as, but not limited to, coordination, configuration, scheduling, arbitration, supervising, operation and/or management of components of system 1000 and their operations. For example, controller 1150 may control the movement of printing units 1050A-F and the printed objects in printing zone 1100. Controller 1150 may comprise any required or suitable hardware, software, firmware or a combination thereof. For example, controller 1150 may be a computing device comprising a controller and/or central processing unit (CPU), a memory and input and output units.

Image acquisition unit 1200 may comprise a detector or imaging device 1210, such as camera or charge coupled device (CCD) to inspect the status and condition of the nozzles by acquiring, for example, images of droplets of material that exits the nozzles. Any other suitable visual detector or any other method of identifying the status of the nozzles may be used. Image acquisition unit 1200 may further comprise an image processing unit 1220 to analyze the images and determine the current status of the inspected nozzles and storage 1230 to store data related to the status of the nozzles.

According to embodiments of the invention, detector 1210 may be coupled to a dedicated computing and storage device for processing and storing the captured images or alternatively controller 1150 may perform these operations. According to embodiments of the invention, a pulsed light source, such as a pulsed laser source or a pulsed light emitting diode (LED) may be coupled to detector 1210 to enable imaging of droplets being deposited from the nozzles. Controller 1150 may further control and manage the inspection procedure, for example coordinating the ejection of droplets, the light pulses and the operation of the camera.

Figure 14:
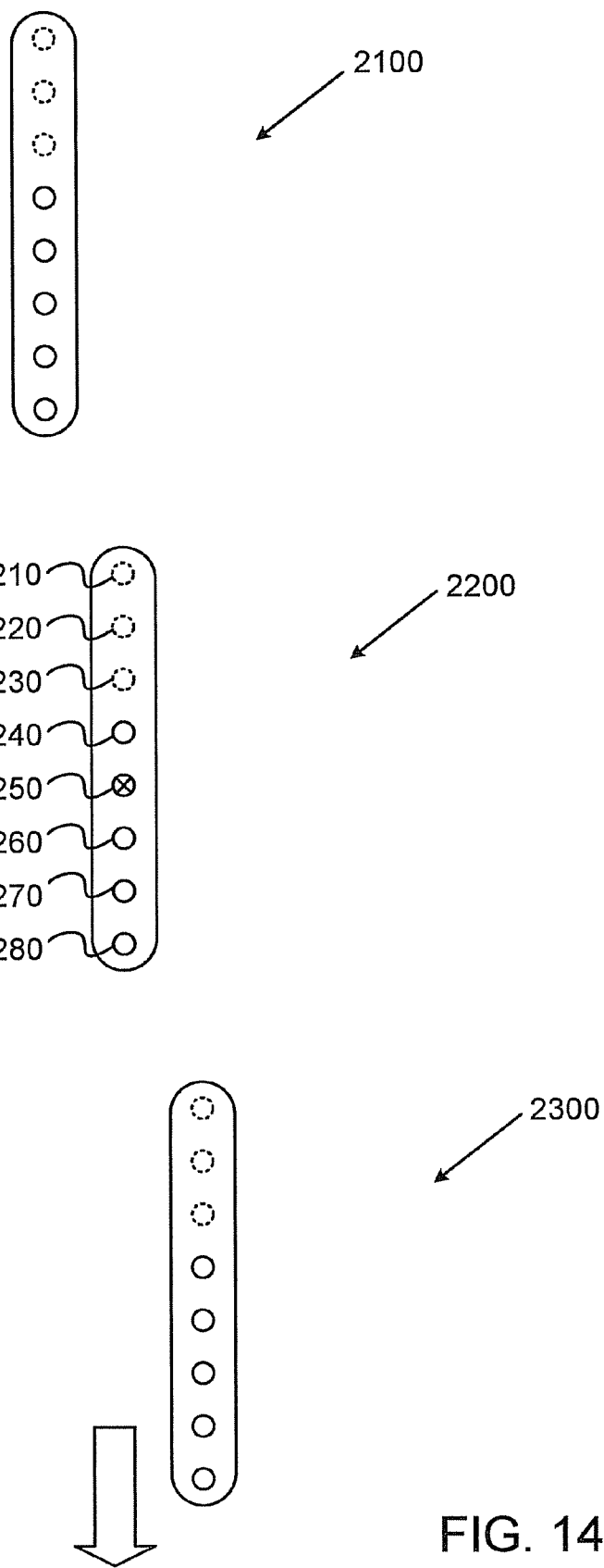
FIG. 14 shows printing units having redundant nozzles and positioned parallel to the print direction helpful in demonstrating embodiments of the invention.

Reference is now made to FIG. 14, which illustrates an array of printing units having redundant nozzles and positioned parallel to the print direction to demonstrate embodiments of the invention. Printing units 2100, 2200 and 2300 may be used to print conductive lines on a semiconductor wafer in the production of solar cells. According to embodiments of the invention, during printing, a first subset of nozzles may be designated as active nozzles, for example, nozzles 2240-2280 may be designated as active. A second subset of nozzles within printing unit 2200, for example, nozzles 2210-2230 may be designated as inactive. Upon identifying that a nozzle, for example, nozzle 2250 is defective, the defective nozzle may be substituted by any one of the inactive nozzles 2210-2230. For example, nozzle 2250 may be re-designated as inactive and nozzle 2220 may be re-designated as active.

According to embodiments of the invention, while a print process is in progress and while one or more printing units defining a first subset of printing units is actively depositing, another one or more printing units defining a second subset of printing units may move to service zone 1250 for maintenance and/or inspection. Further, if desired, the status of at least one pair of nozzles may be interchanged such that the previously active nozzle would become inactive and the previously inactive nozzle would become active.

The printing units relocated to service zone 1250 may be inspected, serviced and configured. For example, nozzles may be inspected by acquiring images of droplets dispensed or ejected by nozzles of the inspected unit. The images may then be analyzed by image processing unit 1220. Based on the analysis, faulty nozzles may be identified and replaced by redundant nozzles. Further, various working parameters may be modified or verified. For example, based on the inspection of a nozzle, working parameters such as pressure, temperature or voltage may be modified.

Referring back to FIG. 13, image processing unit 1220 may receive images from detector 1210 and process such images by applying any suitable image processing techniques. For example, analysis of shape, trajectory and velocity of jetted droplets may be performed by the image processing unit. For example, image processing may be used to determine a condition of a nozzle based on an image of droplets being ejected from the nozzle. Another example may be comparing two or more images, possibly acquired over a predefined period of time. By comparing or otherwise relating images, various conditions, faults or other aspects of a nozzle may be determined. For example, degradation in the performance of a nozzle may be detected by comparing consecutive or successive images.

While a video camera may provide images related to visible light, other images may be produced. For example, detector 1210 may be an infrared camera that may record temperatures, thus providing a temperature distribution of ejected ink or aerosol. While as described herein, imaging device or detector 1210 may be placed at the service area, other configurations are possible. For example, one or more cameras may be placed near, around or in proximity of a printing area, e.g., area 1100. Such cameras may obtain images during the printing process of nozzles depositing material onto a test substrate.

Storage system or unit 1230 may receive and store images acquired by detector 1210 and/or obtained from a different source, e.g., a remote server or a removable storage media such as a compact disk (CD) or memory chip. For example, reference images of a desired ejection may be loaded into or otherwise stored in a storage device and may be used for comparing with or otherwise relating to images acquired by detector 1210. A reference image may contain an image of an ideal, otherwise desirable ejection or deposition and thus may be used, for example by comparing it to a second image in order to determine if an injection imaged in the second image is acceptable or otherwise determine a quality of the ejection or other functional parameters related to the nozzle from which the imaged droplet has jetted.

It should be appreciated by those skilled in the art that the redundancy of the printing unit or print heads may enable dynamically selecting the print heads that participate in a print process. Accordingly, redundant, spare, unused or idle print heads may exist and/or be available during a print process. Such redundant print heads may enable dynamic replacement of print heads while a print process is ongoing, active or in progress. For example, if a first print head is active, e.g., actively participating in a print process by depositing material on a media, needs, or is selected to be serviced or inspected, a second, inactive, idle or redundant print head may replace the first print head by being made active. Accordingly, the first print head, now being replaced, may be made inactive and may further be inspected, serviced or be otherwise subjected to a maintenance procedure.

According to embodiments of the invention, the printing units or print heads may be equipped with redundant nozzles. For example, a print head that may require one hundred (100) nozzles in order to perform its intended tasks may be equipped with five hundred (500) nozzles. Accordingly, only a subset of nozzles fitted, included or installed in a print head may actively participate in a print process, e.g., actually eject material onto a surface or media. According to embodiments of the invention, redundancy of nozzles as described herein may enable dynamically selecting or designating a subset of nozzles as active. Such redundancy may further enable replacing active nozzles by inactive ones. For example, upon determining that a first nozzle in a print head needs to be replaced or serviced, e.g., due to a malfunction or as part of a scheduled or periodic maintenance routine, a second, inactive or redundant nozzle may be selected, made active, and may replace the first nozzle by ejecting material onto a surface or media.

Figure 15:
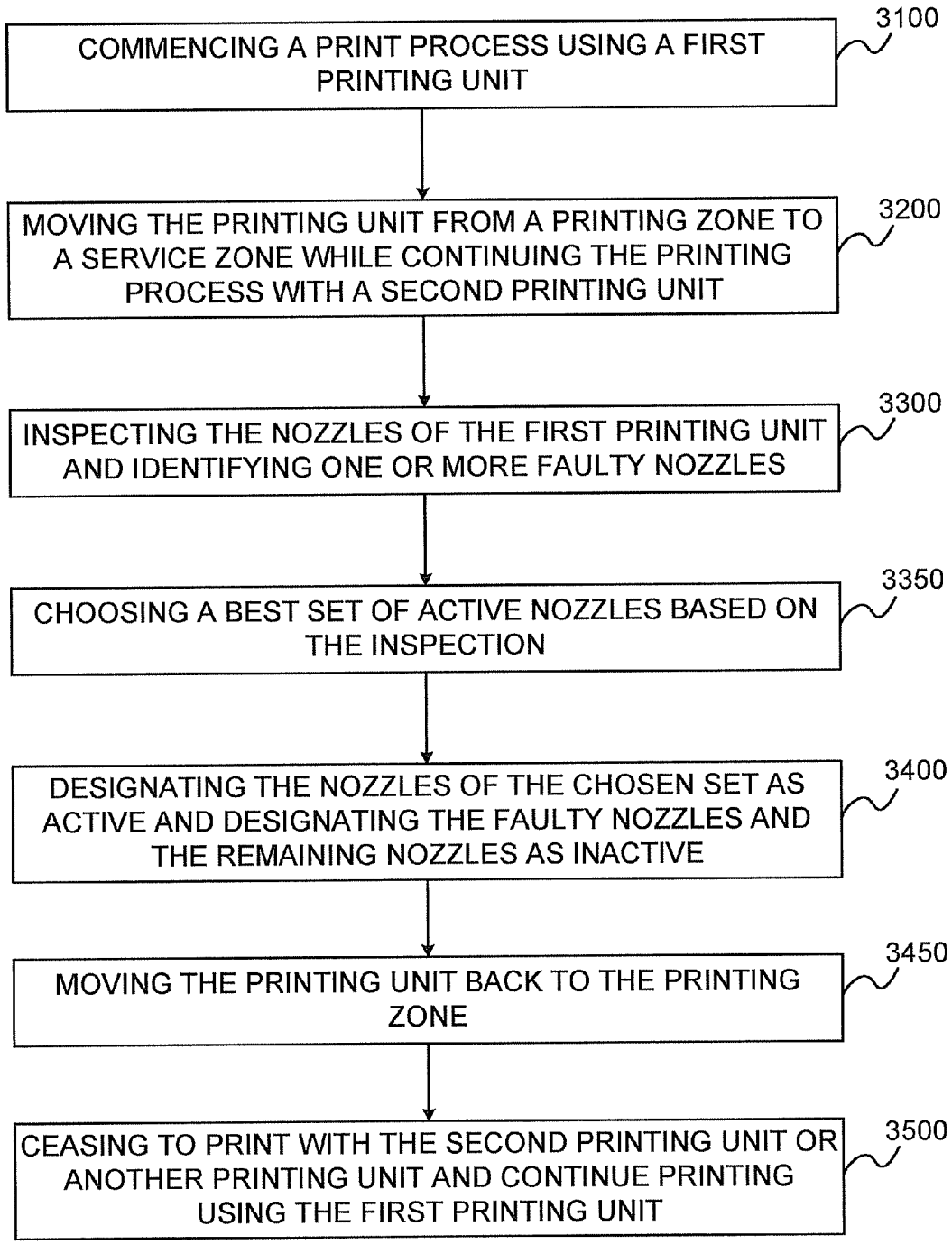
FIG. 15 is a flowchart diagram illustrating a method for printing according to some embodiments of the present invention.

Reference is made to FIG. 15 showing a flowchart diagram illustrating a method for printing according to some embodiments of the present invention. As shown by block 3100, the method may include commencing a print process using a first printing unit or print head. For example, information in a print file may be provided to a printing system such as system 1000 described in FIG. 13. Provided with such information, controller 1150 may cause a conveyor to locate wafers such that a subset of nozzles, designated as active nozzles in both printing units 2300 and 2200 may deposit conductive material on them. Based on information in such print file, controller 1150 may control the nozzles and printing units such that material is deposited according to specifications or parameters in the print file.

As shown by block 3200, the method may include moving the one or more printing units, for example printing unit 2200 to a service zone. During the time that the printing unit is being inspected and/or serviced at the service zone, another printing unit, such as printing unit 210 that was previously redundant may become active so that the printing process may continue with printing units 2100 and 2300. As shown by block 3300, the method may include inspecting the nozzles of printing unit 2000 and identifying one or more nozzles, for example nozzle 2250 as faulty or defective nozzle.

The method may include determining whether the fault can be repaired. For example, if a total obstruction of a nozzle's orifice is detected, a procedure may exist to remove the obstructions from the orifice thus repairing the fault. Other detected faults may be such that require a complex, possibly manual procedure in order to be fixed. Classifying a fault as one that may be handled or repaired immediately or while a print process is in progress may be according to various parameters and/or configurations. If the fault may be repaired, flow may include servicing the nozzle. For example, the working parameters may be modified or an automated purging procedure may be executed.

As shown by block 3350, the method may include choosing a best set of nozzles as best nozzles based on the inspection. Accordingly, the method may include designating a faulty nozzle as inactive when repair is impossible or undesirable. Nozzles identified as inactive may not participate in the printing process until their status is changed to "active". As shown by block 3400, the method may comprise designating the nozzles of the chosen set as active and the faulty nozzles and remaining nozzles of the printing unit as inactive. For example, the method may include designating a nozzle, from the same row of the newly faulty nozzle that was previously designated an inactive nozzle as active. For example, after determining that nozzle 2250 is faulty, a redundant nozzle that was previously inactive and did not participate in the printing process, such as nozzle 2230 may be designated as an active nozzle that would replace the faulty nozzle 2250.

While as described herein, a first, faulty nozzle may be designated as inactive and a second, inactive nozzle may be designated as active in order to compensate for the faulty nozzle, other scenarios are possible. For example, nozzles with the same printing unit and possibly the same row may be replaced based on a predefined schedule. For example, in order to avoid drying of ink in nozzles, nozzles may be designated as active or inactive periodically. While in some embodiments a first nozzle may be replaced by a second nozzle, other combinations are possible. For example, a faulty nozzle may be replaced by two redundant nozzles. For example, such two nozzles may be instructed such that their combined operation is the same as an expected operation of the faulty, replaced nozzle.

As shown by block 3450, the method may include after the inspection is over, moving the first printing unit back to the printing zone. As other print heads may be printing at such time, printing unit 2200 may replace, for example, printing unit 2100 in performing the ongoing print process and printing unit 2100 may be moved to the service area for inspection. Alternatively, printing unit 2200 may replace, for example, printing unit 2300 in performing the ongoing print process and printing unit 2300 may be moved to the service area for inspection. Accordingly, as shown by block 3500, the method may comprise ceasing to print with a working printing unit and continuing with the print process using the first printing unit. The first printing unit may be for example, unit 2200 in which the newly active nozzle, nozzle 2210 replaces the previously used and now faulty nozzle 2250.

Embodiments of the invention may include an article such as a computer or processor readable medium, or a computer or processor storage medium, such as for example a memory, a disk drive, or a USB flash memory, encoding, including or storing instructions, e.g., computer-executable instructions, which when executed by a processor or controller, carry out methods disclosed herein.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. A system for producing printed electronics by depositing conductive ink, the system comprising:
   a housing configured to house at least one movable print unit and a motor configured to move the at least one movable print unit, wherein the at least one movable print unit includes a plurality of nozzles configured to deposit patterns of electrically conductive material on an object;
   a conveyor configured to move the object relative to the housing;
   a memory for storing a print file containing specifications of a printed electronics pattern; and
   a controller configured to selectively move the conveyor in a manner enabling the electronics pattern to be printed on the object, wherein the controller is configured to cause printing of multilayered conductive lines forming a conductive path on the object in a single pass, wherein the housing is further configured to house a plurality of movable print units, and each of the movable print units being independently movable relative to the other movable print units during printing and including one or more fixed print heads, and wherein positions of the plurality of movable print units are determined by an optimization calculation; and wherein the optimization calculation takes into account:
specific image data; and
nozzle status data, wherein nozzle status data includes nozzle jet direction.

2. The system of claim 1, wherein the conveyor includes a platform defining a width of a print area.

3. The system of claim 1, wherein the housing is located in a fixed position facing the conveyor.

4. The system of claim 1, wherein the housing is configured to move the at least one movable print unit relative to the conveyor.

5. The system of claim 1 further includes a visual image detector, the visual image detector being configured to acquire images of droplets of the conductive material deposited from the plurality of nozzles indicating conditions of the plurality of nozzles.

6. The system of claim 1, wherein the housing is further configured to house a plurality of movable print units configured to move along a plurality of printing axes, and wherein at least two of the print axes overlap.

7. The system of claim 1, wherein the controller is further configured to:
designate a first subset of nozzles as active nozzles and a second subset of nozzles as inactive nozzles;
move the conveyor to locate the object underneath the first subset of nozzles; and
instruct the first subset of nozzles to print the electronics pattern on the object.

8. The system of claim 1, wherein the at least one movable print unit includes multiple movable print units and the controller is further configured to use data regarding relative strengths of the plurality of nozzles to determine a homogenized print head arrangement for the multiple movable print units.

9. The system of claim 1, wherein the at least one movable print unit includes multiple movable print units and the controller is further configured to select a first subset of print heads for depositing material on a substrate, while a second different subset of print heads is undergoing a maintenance procedure in a position outside of a print area.

10. The system of claim 1, wherein each line is printed using a repeating pattern of output.

11. The system of claim 1, wherein the optimization calculation comprises:
determining a homogenized print head arrangement for the plurality of moveable print units.

12. The system of claim 1, wherein the positions of the plurality of movable print units are capable of being dynamically changed during printing by the controller.

* * * * *